(12) United States Patent
Lee

(10) Patent No.: US 10,904,466 B2
(45) Date of Patent: Jan. 26, 2021

(54) DIGITAL CORRELATED DOUBLE SAMPLING CIRCUITS AND IMAGE SENSORS INCLUDING THE SAME

(71) Applicant: Samsung Electronics Co., Ltd., Suwon-si (KR)

(72) Inventor: Hyeok-Jong Lee, Yongin-si (KR)

(73) Assignee: Samsung Electronics Co., Ltd.

( * ) Notice: Subject to any disclaimer, the term of this patent is extended or adjusted under 35 U.S.C. 154(b) by 41 days.

(21) Appl. No.: 16/038,806

(22) Filed: Jul. 18, 2018

(65) Prior Publication Data

US 2019/0098234 A1 Mar. 28, 2019

(30) Foreign Application Priority Data

Sep. 25, 2017 (KR) .......................... 10-2017-0123532

(51) Int. Cl.
*H04N 5/357* (2011.01)
*H04N 5/378* (2011.01)
*H03M 1/08* (2006.01)
*H03M 1/14* (2006.01)
*H03M 1/12* (2006.01)
*H04N 5/363* (2011.01)

(52) U.S. Cl.
CPC ........ *H04N 5/3575* (2013.01); *H03M 1/0872* (2013.01); *H03M 1/1245* (2013.01); *H03M 1/144* (2013.01); *H04N 5/363* (2013.01); *H04N 5/378* (2013.01)

(58) Field of Classification Search
CPC ...... H04N 5/3575; H04N 5/363; H04N 5/378; H04N 5/374; H03M 1/1245; H03M 1/144; H03M 1/0872; H03M 1/123; H03M 1/56

USPC ........................................................ 348/308
See application file for complete search history.

(56) References Cited

U.S. PATENT DOCUMENTS

| 7,671,317 | B2 | 3/2010 | Shimomura |
| 8,462,246 | B2 | 6/2013 | Lee |
| 9,380,246 | B2 | 6/2016 | Lee |
| 9,681,082 | B2 * | 6/2017 | Lee ........................ H04N 5/378 |
| 2005/0259058 | A1 * | 11/2005 | Yamaguchi .......... G09G 3/3688 345/87 |
| 2013/0120622 | A1 | 5/2013 | Hiraoka |
| 2013/0335609 | A1 | 12/2013 | Higuchi |

(Continued)

FOREIGN PATENT DOCUMENTS

JP 2016184893 10/2016

*Primary Examiner* — Lin Ye
*Assistant Examiner* — Chan T Nguyen
(74) *Attorney, Agent, or Firm* — Myers Bigel, P.A.

(57) ABSTRACT

A digital correlated double sampling (CDS) circuit includes a first latch circuit, a first converting circuit, a second converting circuit, a second latch circuit, and a calculating circuit. The first latch circuit latches an input phase shift code based on a first control signal to store first and second phase shift codes. The first converting circuit converts the first and second phase shift codes into first and second Gray codes. The second converting circuit converts the first Gray code and the second Gray code into a first binary code and a second binary code. The second latch circuit latches an output of the second converting circuit based on a second control signal to store the first binary code. The calculating circuit operates on the first binary code and the second binary code to generate a third binary code, and outputs the third binary code.

20 Claims, 21 Drawing Sheets

(56) References Cited

U.S. PATENT DOCUMENTS

| | | |
|---|---|---|
| 2015/0124137 A1 | 5/2015 | Sato |
| 2015/0138408 A1* | 5/2015 | Lee ................. H04N 5/378 348/294 |
| 2015/0326243 A1 | 11/2015 | Iwaki |
| 2015/0381911 A1* | 12/2015 | Shen ................ H04N 5/378 348/241 |
| 2016/0119567 A1 | 4/2016 | Okura |

\* cited by examiner

1100

DIGITAL CORRELATED DOUBLE SAMPLING CIRCUITS AND IMAGE SENSORS INCLUDING THE SAME

CROSS-REFERENCE TO RELATED APPLICATION

This application claims priority under 35 USC § 119 to Korean Patent Application No. 10-2017-0123532, filed on Sep. 25, 2017, in the Korean Intellectual Property Office (KIPO), the entire contents of which are herein incorporated by reference.

BACKGROUND

1. Technical Field

Example embodiments relate generally to correlated double sampling (CDS) technologies, and more particularly to digital CDS circuits and image sensors including digital CDS circuits.

2. Description of the Related Art

Complementary metal oxide semiconductor (CMOS) image sensors have been used as devices for capturing images. Typically, analog pixel signals output from a pixel array of the CMOS image sensor may have variations due to differences between intrinsic characteristics of pixels, such as fixed pattern noise (FPN), and digital pixel signals generated based on the analog pixel signals may have variations due to differences between characteristics of analog-to-digital (ADC) converters that are located corresponding to columns of the pixel array of the CMOS image sensor. To compensate such variations, CDS technologies may be used to operate the CMOS image sensors. Recently, frame rates and operating frequencies of CMOS image sensors have increased, and thus power consumption of the CMOS image sensors may also increase.

SUMMARY

At least one example embodiment of the inventive concepts provides digital CDS circuits capable of operating with relatively high speed and low power consumption.

At least one example embodiment of the inventive concepts provides image sensors including the digital CDS circuit.

According to example embodiments, a digital CDS circuit includes a first latch circuit, a first converting circuit, a second converting circuit, a second latch circuit, and a calculating circuit. The first latch circuit latches an input phase shift code based on a first control signal to sequentially store a first phase shift code and a second phase shift code. The first phase shift code represents a reset component. The second phase shift code represents an image component. The first converting circuit converts the first phase shift code and the second phase shift code into a first Gray code and a second Gray code, respectively. The second converting circuit converts the first Gray code and the second Gray code into a first binary code and a second binary code, respectively. The second latch circuit latches an output of the second converting circuit based on a second control signal to store the first binary code. The calculating circuit subtracts the reset component from the image component based on the first binary code and the second binary code to generate a third binary code, and sequentially outputs the third binary code. The third binary code represents an effective image component.

According to example embodiments of the inventive concepts, a digital CDS circuit includes a first latch circuit, a first converting circuit, a second latch circuit, a second converting circuit, and a calculating circuit. The first latch circuit latches an input phase shift code based on a first control signal to sequentially store a first phase shift code and a second phase shift code. The first phase shift code represents a reset component. The second phase shift code represents an image component. The first converting circuit converts the first phase shift code and the second phase shift code into a first Gray code and a second Gray code, respectively. The second latch circuit latches an output of the first converting circuit based on a second control signal to store the first Gray code. The second converting circuit converts the first Gray code and the second Gray code into a first binary code and a second binary code, respectively. The calculating circuit subtracts the reset component from the image component based on the first binary code and the second binary code to generate a third binary code, and sequentially outputs the third binary code. The third binary code represents an effective image component.

According to example embodiments of the inventive concepts, an image sensor includes a pixel array, a comparison block, and a digital CDS block. The pixel array generates a plurality of analog pixel signals based on incident light. The comparison block compares the plurality of analog pixel signals with a ramp signal to generate a plurality of first control signals and a plurality of second control signals. The digital CDS block includes a plurality of digital CDS circuits, and performs a digital CDS based on the plurality of first control signals, the plurality of second control signals and an input phase shift code to generate a plurality of effective image binary codes. Each of the plurality of digital CDS circuits includes a first latch circuit, a first converting circuit, a second converting circuit, a second latch circuit and a calculating circuit. The first latch circuit latches the input phase shift code based on one of the plurality of first control signals to sequentially store a first phase shift code and a second phase shift code. The first phase shift code represents a reset component. The second phase shift code represents an image component. The first converting circuit converts the first phase shift code and the second phase shift code into a first Gray code and a second Gray code, respectively. The second converting circuit converts the first Gray code and the second Gray code into a first binary code and a second binary code, respectively. The second latch circuit stores the first binary code or the first Gray code based on one of the plurality of second control signals. The calculating circuit subtracts the reset component from the image component based on the first binary code and the second binary code to generate a third binary code, and sequentially outputs the third binary code. The third binary code represents an effective image component.

In the digital CDS circuit and the image sensor including the digital CDS circuit according to example embodiments of the inventive concepts, the CDS operation may be performed in each column of the image sensor, and the effective image binary code may be generated by sequentially converting the phase shift code into the Gray code and converting the Gray code into the binary code. The digital CDS circuit may operate based on the phase shift code having a relatively low frequency, and may have an output or a calculating result substantially the same as that of a conventional digital CDS circuit operating based on the Gray code. In other words, a relatively precise and/or detailed representation may be implemented with the phase shift code having a relatively low frequency, and thus power consumption may be reduced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
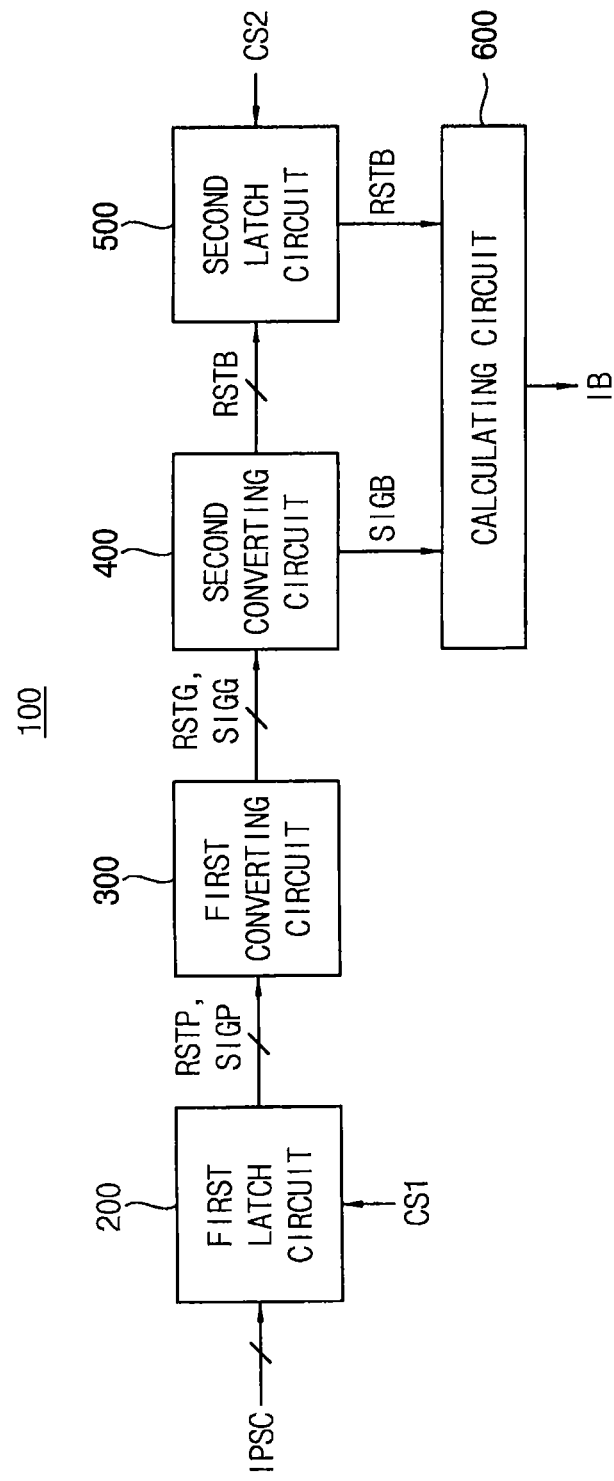
FIG. 1 is a block diagram illustrating a digital CDS circuit according to example embodiments of the inventive concepts.

Various example embodiments of the inventive concepts will be described more fully with reference to the accompanying drawings, in which embodiments of the inventive concepts are shown. The present inventive concepts may, however, be embodied in many different forms and should not be construed as limited to the embodiments set forth herein. Like reference numerals refer to like elements throughout this application.

FIG. 1 is a block diagram illustrating a digital correlated double sampling (CDS) circuit 100 according to example embodiments of the inventive concepts.

Referring to FIG. 1, a digital CDS circuit 100 may include a first latch circuit 200, a first converting circuit 300, a second converting circuit 400, a second latch circuit 500, and a calculating circuit 600.

The first latch circuit 200 may latch an input phase shift code IPSC based on a first control signal CS1 to sequentially store a first phase shift code RSTP and a second phase shift code SIGP. The first phase shift code RSTP represents a reset component, and the second phase shift code SIGP represents an image component or a signal component.

The reset component and the image component may indicate components that are included in analog pixel signals output from a pixel array of an image sensor. As will be described with reference to FIG. 13, the digital CDS circuit 100 may be included in the image sensor and may be disposed at a later stage of the pixel array.

The first converting circuit 300 may convert the first phase shift code RSTP and the second phase shift code SIGP into a first Gray code RSTG and a second Gray code SIGG, respectively. Gray codes, also known as reflected binary codes, are described in U.S. Pat. No. 2,632,058 to Frank Gray entitled "Pulse Code Communication." The second converting circuit 400 may convert the first Gray code RSTG and the second Gray code SIGG into a first binary code RSTB and a second binary code SIGB, respectively.

Similarly to the first phase shift code RSTP, each of the first Gray code RSTG and the first binary code RSTB may represent the reset component. Similarly to the second phase shift code SIGP, each of the second Gray code SIGG and the second binary code SIGB may represent the image component.

The second latch circuit 500 may latch an output of the second converting circuit 400 based on a second control signal CS2 to store the first binary code RSTB.

The calculating circuit 600 may subtract the reset component from the image component bit by bit based on the first binary code RSTB and the second binary code SIGB to generate a third binary code IB, and may sequentially output the third binary code IB bit by bit. As used herein, "bit by bit" means that individual bits of a given value are processed sequentially. The third binary code IB may represent an effective image component. An operation of obtaining the effective image component by subtracting the reset component from the image component may be referred to as a CDS operation or simply a CDS. To generate the third binary code IB bit by bit, the calculating circuit 600 may receive the first binary code RSTB from the second latch circuit 500 bit by bit and may receive the second binary code SIGB from the second converting circuit 400 bit by bit.

In some example embodiments, the input phase shift code IPSC may include a plurality of phase shift signals that have the same period. A phase of each of the plurality of phase shift signals may partially overlap phases of the others of the plurality of phase shift signals. For example, the plurality of phase shift signals may include first through $(2^n-1)$-th phase shift signals where n is a natural number greater than or equal to two. As used herein, a kth phase shift signal will be considered to be adjacent to a (k−1)th and (k+1)th phase shift signal. As will be described with reference to FIGS. 2 and 6, a least significant bit (LSB) of the first Gray code RSTG and an LSB of the second Gray code SIGG may be generated based on at least two of the plurality of phase shift signals. A most significant bit (MSB) of the first Gray code RSTG and an MSB of the second Gray code SIGG may be generated based on one of the plurality of phase shift signals.

In some example embodiments, each of the first latch circuit 200 and the second latch circuit 500 may include a plurality of latches. Each of the first converting circuit 300 and the second converting circuit 400 may include at least one XOR gate. The calculating circuit 600 may include a 1-bit full adder.

Figure 2:
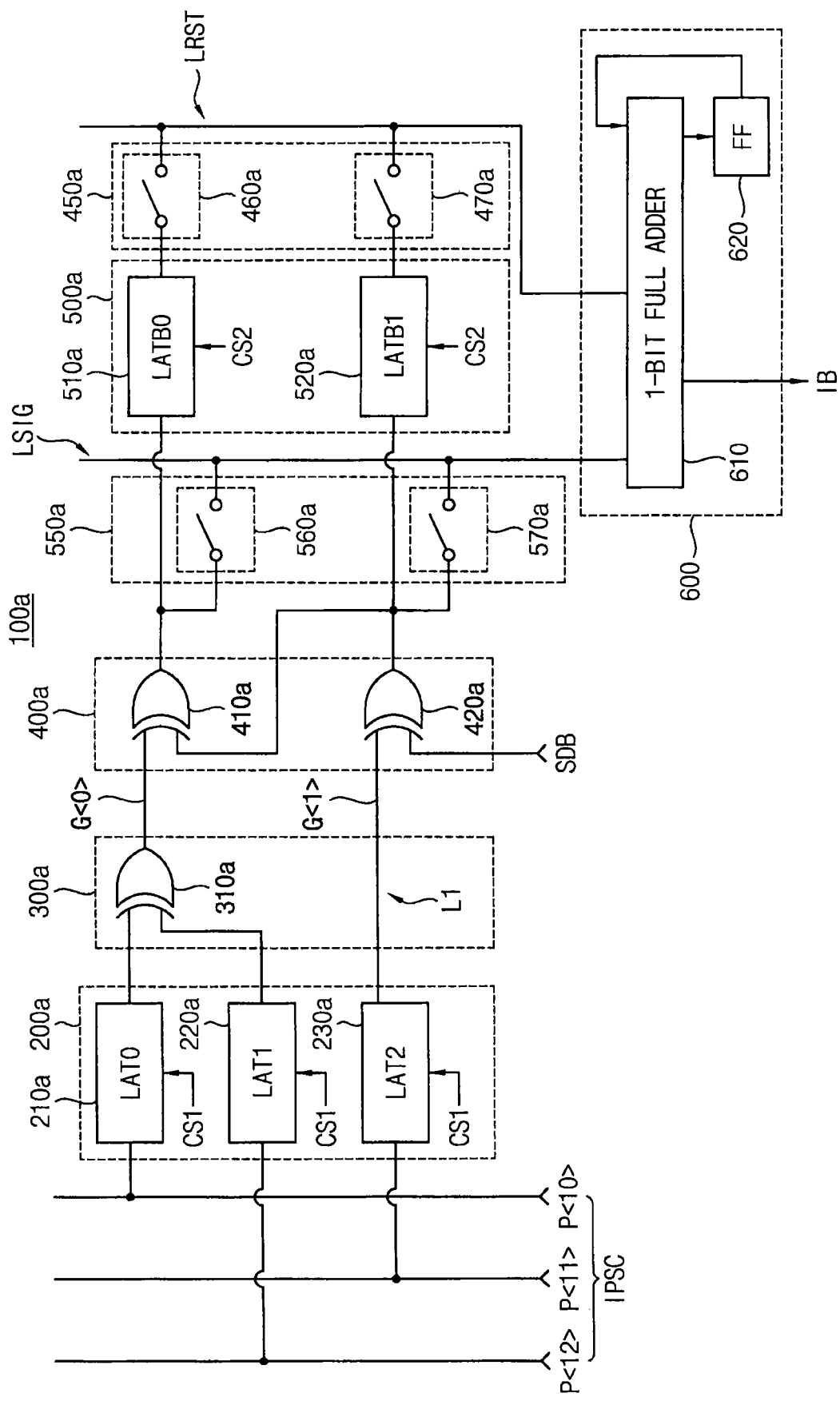
FIG. 2 is a block diagram illustrating an example of the digital CDS circuit of FIG. 1.
Figure 3A:
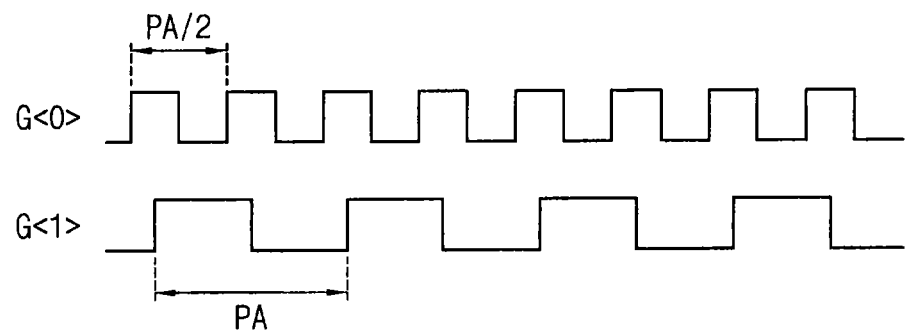
FIGS. 3A and 3B are diagrams describing an operation of the digital CDS circuit of FIG. 2.
Figure 3B:
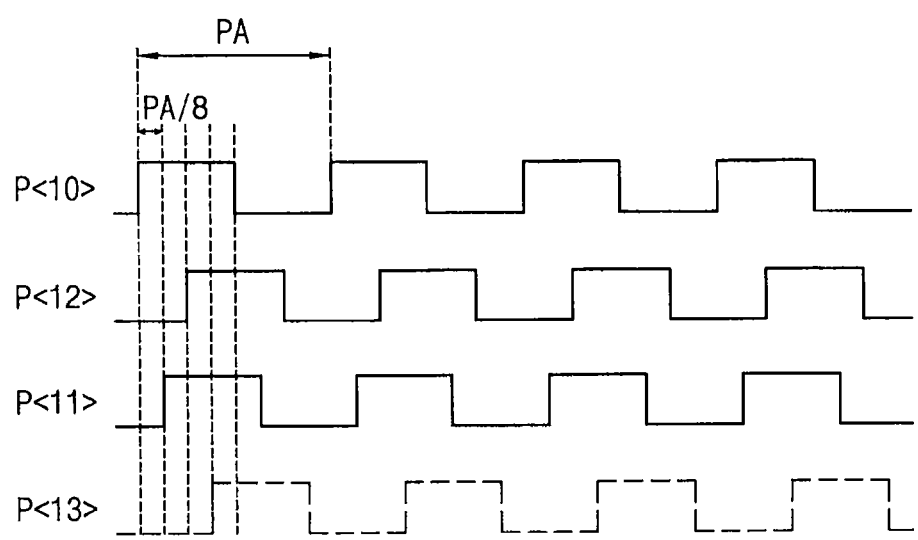

FIG. 2 is a block diagram illustrating an example of the digital CDS circuit 100 of FIG. 1. FIGS. 3A and 3B are diagrams for describing an operation of the digital CDS circuit 100a of FIG. 2. FIG. 3A illustrates waveforms of two Gray signals G<0> and G<1> that are used for generating a 2-bit Gray code. FIG. 3B illustrates waveforms of phase shift signals P<10>, P<11>, P<12>, and P<13> that are used in the digital CDS circuit 100a of FIG. 2 and are used for generating the 2-bit Gray code.

Referring to FIGS. 2, 3A, and 3B, a digital CDS circuit 100a may include a first latch circuit 200a, a first converting circuit 300a, a second converting circuit 400a, a second latch circuit 500a, and a calculating circuit 600. The first latch circuit 200a, first converting circuit 300a, second converting circuit 400a, second latch circuit 500a, and calculating circuit 600 of FIG. 2 may be the same or similar to the first latch circuit 200, first converting circuit 300, second converting circuit 400, second latch circuit 500, and calculating circuit 600 illustrated in FIG. 1. The digital CDS circuit 100a may further include a first switch circuit 450a and a second switch circuit 550a.

The digital CDS circuit 100a of FIG. 2 may generate the 2-bit Gray code based on the input phase shift code IPSC that includes three phase shift signals P<10>, P<11>, and P<12> among four phase shift signals P<10>, P<11>, P<12>, and P<13>. The four phase shift signals P<10>, P<11>, P<12>, and P<13> may have the same period, and a phase of each of the four phase shift signals may partially overlap phases of the others of the four phase shift signals. In other words, the input phase shift code IPSC that is used in the digital CDS circuit 100a of FIG. 2 may be a 4-phase phase shift code.

The first latch circuit 200a may include a plurality of image latches 210a, 220a, and 230a. The image latch 210a may latch the phase shift signal P<10> in response to the first control signal CS1. The image latch 220a may latch the phase shift signal P<12> in response to the first control signal CS1. The image latch 230a may latch the phase shift signal P<11> in response to the first control signal CS1. The number of the plurality of image latches 210a, 220a, and 230a may be substantially equal to the number of the phase shift signals P<10>, P<11>, and P<12> that are included in the input phase shift code IPSC.

The first converting circuit 300a may include an XOR gate 310a and a signal line L1. The signal line L1 may output a phase shift bit that is stored in the image latch 230a and corresponds to the phase shift signal P<11> as an MSB of a Gray code (e.g., G<1>). The XOR gate 310a may perform an XOR operation on phase shift bits that are stored in the image latches 210a and 220a and correspond to the phase shift signals P<10> and P<12> to generate an LSB of the Gray code (e.g., G<0>).

The second converting circuit 400a may include a plurality of XOR gates 410a and 420a. The XOR gate 420a may perform the XOR operation on the MSB of the Gray code that is output from the signal line L1 and a sign determination bit SDB to generate an MSB of a binary code. The XOR gate 410a may perform the XOR operation on the MSB of the binary code that is output from the XOR gate 420a and the LSB of the Gray code that is output from the XOR gate 310a to generate an LSB of the binary code.

The second latch circuit 500a may include a plurality of reset latches 510a and 520a. The reset latch 510a may latch the LSB of the binary code that is output from the XOR gate 410a in response to the second control signal CS2. The reset latch 520a may latch the MSB of the binary code that is output from the XOR gate 420a in response to the second control signal CS2. The number of the plurality of reset latches 510a and 520a may be substantially equal to the number of bits of the binary code that is generated by the second converting circuit 400a and/or the number of bits of the Gray code that is generated by the first converting circuit 300a.

The first switch circuit 450a may sequentially provide the binary code that is stored in the second latch circuit 500a to the calculating circuit 600 bit by bit. The first switch circuit 450a may include a plurality of switches 460a and 470a. Each of the plurality of switches 460a and 470a may selectively connect a respective one of the plurality of reset latches 510a and 520a that are included in the second latch circuit 500a with a reset signal line LRST. The reset signal line LRST may provide the first binary code RSTB to the calculating circuit 600.

The second switch circuit 550a may sequentially provide the binary code that is output from the second converting circuit 400a to the calculating circuit 600 bit by bit. The second switch circuit 550a may include a plurality of switches 560a and 570a. Each of the plurality of switches 560a and 570a may selectively connect a respective one of the plurality of XOR gates 410a and 420a that are included in the second converting circuit 400a with an image signal line LSIG. The image signal line LSIG may provide the second binary code SIGB to the calculating circuit 600.

The calculating circuit 600 may include a 1-bit full adder 610 and a flip-flop 620. The 1-bit full adder 610 may include a first input terminal that is connected to the image signal line LSIG, a second input terminal that is connected to the reset signal line LRST, a third input terminal that receives an output of the flip-flop 620, a first output terminal that outputs the third binary code IB bit by bit, and a second output terminal that outputs a carry bit. The flip-flop 620 may store the carry bit that is output from the second output terminal of the 1-bit full adder 610. For example, the first binary code RSTB may correspond to a negative representation of the first Gray code RSTG, and the 1-bit full adder 610 may add the second binary code SIGB to the first binary code RSTB bit by bit to generate the third binary code IB.

As illustrated in FIG. 3A, the Gray signals G<0> and G<1> for generating the 2-bit Gray code may have different periods. For example, the Gray signal G<1> for generating the MSB of the 2-bit Gray code may have a period of "PA," and the Gray signal G<0> for generating the LSB of the 2-bit Gray code may have a period of about a half of "PA" (e.g., "PA/2"). In other words, a frequency of the Gray signal G<0> may be twice a frequency of the Gray signal G<1>. Unlike a general binary code, the Gray code may be implemented such that two successive values are different by only one bit, so that data errors can be reduced when the Gray code is used as an input/output (I/O) code. However, a frequency and power consumption may increase as an operating speed increases.

As illustrated in FIG. 3B, the phase shift signals P<10>, P<11>, P<12>, and P<13> for generating the 2-bit Gray code may have the same period. For example, a period of each of the phase shift signals P<10>, P<11>, P<12>, and P<13> may be "PA," which is substantially equal to the period of the Gray signal G<1> for generating the MSB of the 2-bit Gray code. A phase of each of the phase shift signals P<10>, P<11>, P<12>, and P<13> may partially overlap phases of the others of the phase shift signals P<10>, P<11>, P<12>, and P<13>, and a phase difference between two adjacent (see FIG. 2) phase shift signals (e.g., the phase shift signals P<10> and P<11>) may be "PA/8." In addition, the phase shift signal P<13> may not be used in the digital CDS circuit 100a of FIG. 2, and thus the phase shift signal P<13> is illustrated by a dotted line in FIG. 3B. FIG. 3B illustrates the phase shift signals P<10>, P<11>, P<12>, and P<13> arranged next to each other in a way that assists in understanding the operations of the digital CDS circuit of FIG. 2. It should be noted that ones of the the phase shift signals P<10>, P<11>, P<12>, and P<13> next to one another in FIG. 3B may not be adjacent one another in the arrangement of the the phase shift signals P<10>, P<11>, P<12>, and P<13> of FIG. 2.

As described with reference to FIGS. 2, 3A, and 3B, the phase shift bit that corresponds to the phase shift signal P<11> may be output as the MSB of the Gray code because the Gray signal G<1> and the phase shift signal P<11> have the same waveform. In addition, the LSB of the Gray code may be generated by performing the XOR operation on the phase shift bits that correspond to the phase shift signals P<10> and P<12> because the Gray signal G<0> and a signal that is generated by performing the XOR operation on the phase shift signals P<10> and P<12> have the same waveform. The phase of the phase shift signal P<10> may lead the phase of the phase shift signal P<11>, and the phase of the phase shift signal P<12> may lag the phase of the phase shift signal P<11>.

The digital CDS circuit 100a according to example embodiments may operate based on the phase shift signals P<10>, P<11>, and P<12> having a relatively low frequency, and may have an output or a calculating result substantially the same as that of a conventional digital CDS circuit operating based on the Gray signals G<0> and G<1>. In the example of FIGS. 2, 3A, and 3B, a frequency of each of the phase shift signals P<10>, P<11>, and P<12> may be about a half of a frequency of the Gray signal G<0>. In other words, using additional latches and XOR gates, a relatively precise and/or detailed representation may be implemented with a relatively low frequency, and thus power consumption may be reduced.

Figure 4:
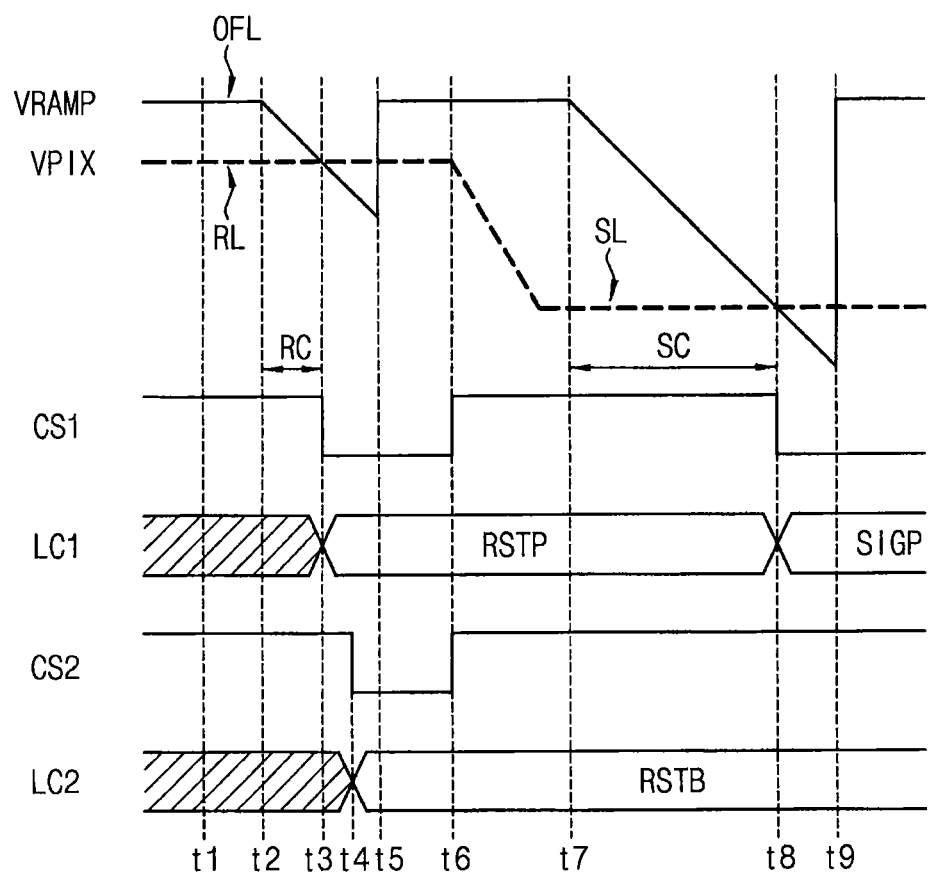
FIGS. 4, 5A, 5B, and 5C are diagrams describing an operation of the digital CDS circuit according to example embodiments of the inventive concepts.
Figure 5A:
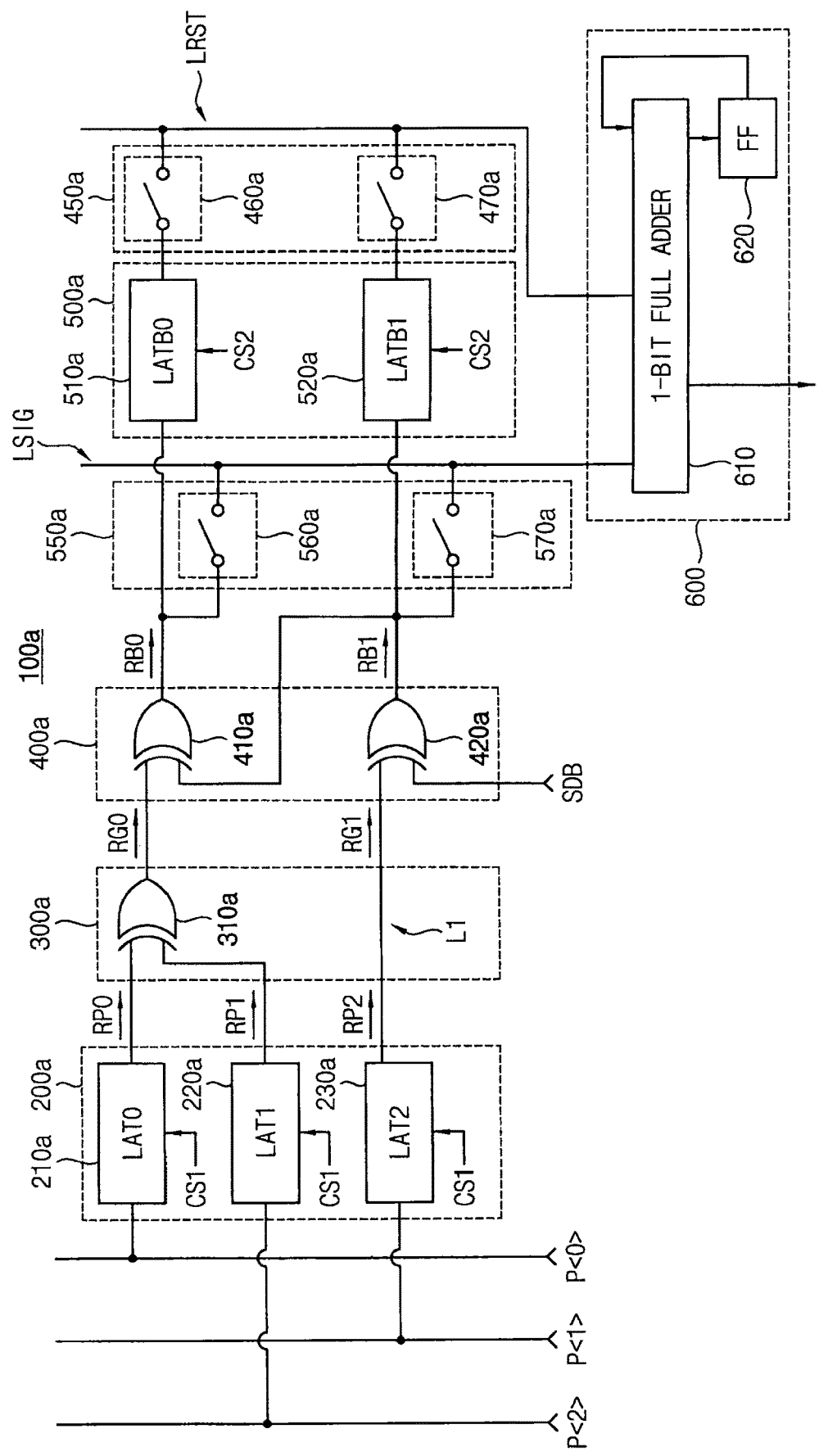
Figure 5B:
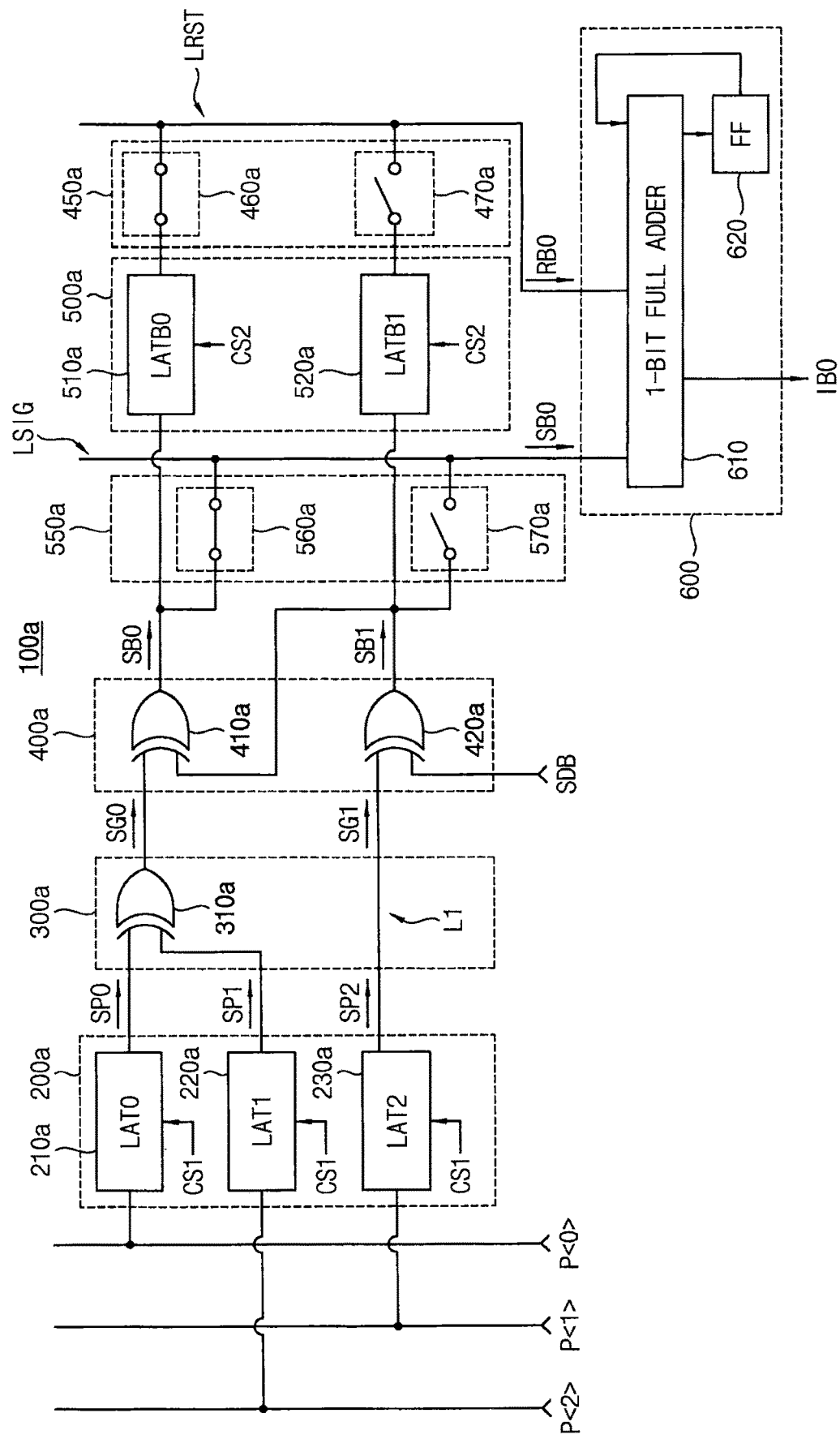
Figure 5C:
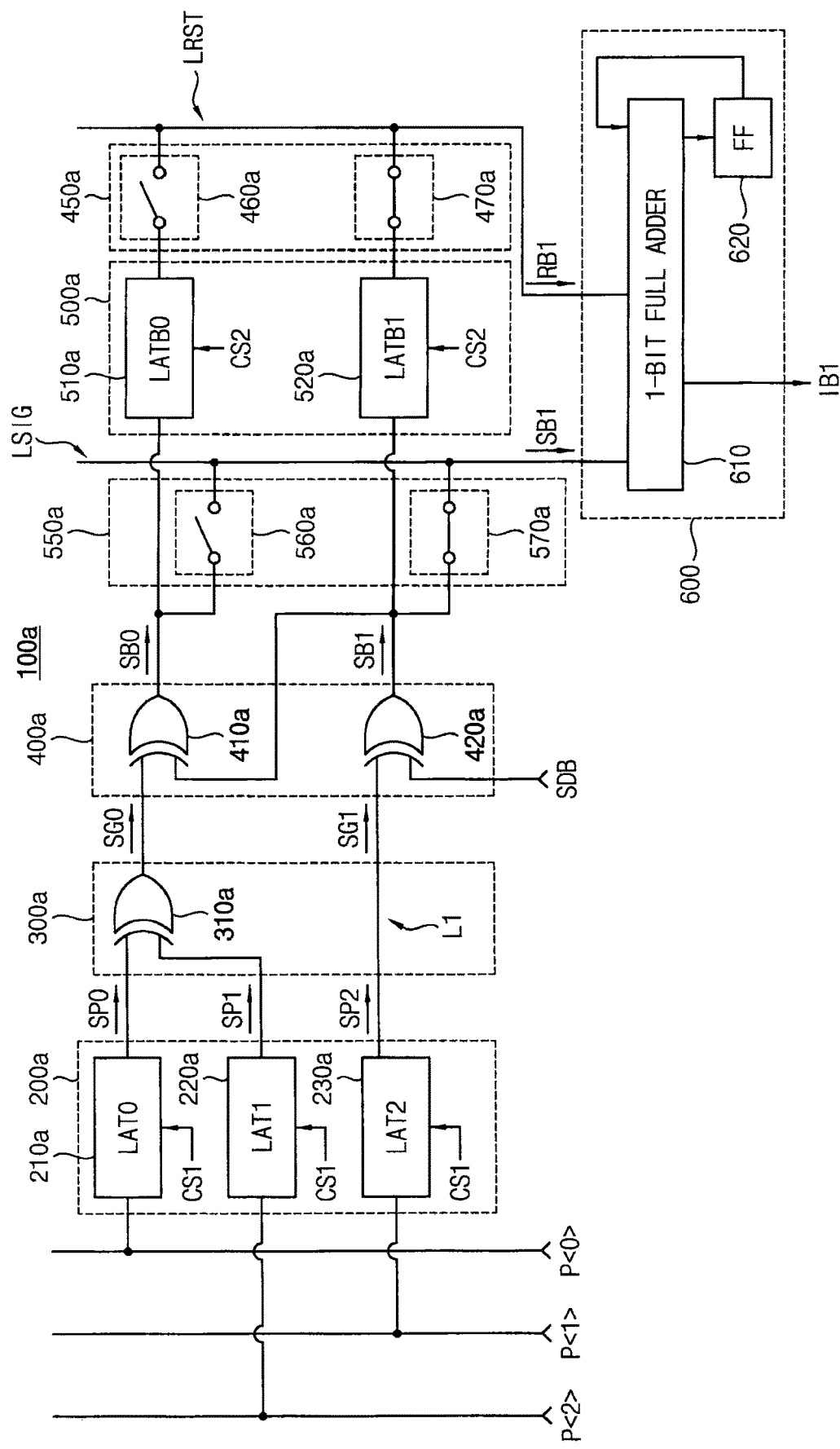

FIGS. 4, 5A, 5B, and 5C are diagrams describing an operation of the digital CDS circuit (e.g., 100 and/or 100a of FIGS. 1 and 2) according to example embodiments of the inventive concepts. FIG. 4 is a timing diagram illustrating signal changes according to the CDS operation. In FIG. 4, LC1 and LC2 represent states of codes stored in the first latch circuit 200 and the second latch circuit 500 in FIG. 1, respectively. FIGS. 5A, 5B and 5C illustrate an operation of the digital CDS circuit 100a of FIG. 2 during durations for detecting the reset component and the image component.

Referring to FIGS. 1 and 4, at time t1, an analog pixel signal VPIX has a reset level RL, and a ramp signal VRAMP has an offset level OFL that is higher than the reset level RL by an offset value. As will be described with reference to FIGS. 13 and 14, the ramp signal VRAMP may be generated from a voltage generator included in an image sensor, and the analog pixel signal VPIX may be generated from a pixel array included in the image sensor. The analog pixel signal VPIX may include the reset component and the image component. The reset level RL may correspond to the reset component of the analog pixel signal VPIX.

At time t2, the ramp signal VRAMP is activated and is decreased from the offset level OFL with a constant slope. The input phase shift code IPSC applied to the first latch circuit 200 may have (e.g., maintain) an initial state until time t2, and may have a predetermined waveform (e.g., waveforms illustrated in FIG. 3B) from time t2.

During a first duration for detecting the reset component from time t2 to time t5, a time point at which the first control signal CS1 is transitioned is determined by comparing the activated ramp signal VRAMP with the analog pixel signal VPIX. Since a level of the ramp signal VRAMP is higher than a level of the analog pixel signal VPIX during a duration from time t2 to time t3 and is lower than the level of the analog pixel signal VPIX during a duration from time t3 to time t5, the first control signal CS1 is transitioned at time t3. For example, the first control signal CS1 may be transitioned from a logic high level to a logic low level.

In addition, at time t3, the first latch circuit 200 temporarily stores the first phase shift code RSTP in response to a transition point (e.g., a falling edge) of the first control signal CS1, and outputs the stored first phase shift code RSTP. A value of the first phase shift code RSTP may correspond to a length of a reset counting duration RC.

At time t4 after time t3, the second control signal CS2 is transitioned. For example, the second control signal CS2 may be transitioned from the logic high level to the logic low level. The second latch circuit 500 stores the first binary code RSTB output from the second converting circuit 400 in response to a transition point (e.g., a falling edge) of the second control signal CS2.

At time t5, the ramp signal VRAMP is deactivated and has the offset level OFL again. At time t6, photo-charges collected by a photoelectric conversion unit included in a unit pixel of the image sensor are transferred to a floating diffusion node included in the image sensor, and the level of the analog pixel signal VPIX is changed from the reset level RL to an image level SL. The image level SL may correspond to the image component of the analog pixel signal VPIX. In addition, at time t6, the first and second control signals CS1 and CS2 may be transitioned from the logic low level to the logic high level.

At time t7, the ramp signal VRAMP is activated and is decreased from the offset level OFL with the constant slope again. The input phase shift code IPSC applied to the first latch circuit 200 may be initialized at any time point after time t5, may have (e.g., maintain) the initial state until time t7, and may have the predetermined waveform from time t7 again.

During a second duration for detecting the image component from time t7 to time t9, another time point at which the first control signal CS1 is transitioned is determined by comparing the activated ramp signal VRAMP with the analog pixel signal VPIX. Since the level of the ramp signal VRAMP is higher than the level of the analog pixel signal VPIX during a duration from time t7 to time t8 and is lower than the level of the analog pixel signal VPIX during a duration from time t8 to time t9, the first control signal CS1 is transitioned at time t8.

In addition, at time t8, the first latch circuit 200 stores the second phase shift code SIGP in response to a transition point of the first control signal CS1. A value of the second phase shift code SIGP may correspond to a length of an image counting duration SC.

Referring to FIGS. 1, 2, 4 and 5A, during the first duration for detecting the reset component (e.g., at time t3), the plurality of image latches 210a, 220a, and 230a temporarily store the first phase shift code RSTP in response to the first control signal CS1, and output reset phase shift bits RP0, RP1, and RP2 of the first phase shift code RSTP.

During the first duration (e.g., after time t3 and before time t4), the signal line L1 outputs the reset phase shift bit RP2 as a reset Gray bit RG1, and the XOR gate 310a performs the XOR operation on the reset phase shift bits RP0 and RP1 to generate a reset Gray bit RG0. The XOR gate 420a performs the XOR operation on the reset Gray bit RG1 and the sign determination bit SDB to generate a reset binary bit RB1. The XOR gate 410a performs the XOR operation on the reset Gray bit RG0 and the reset binary bit RB1 to generate a reset binary bit RB0. For example, to generate the first binary code RSTB that corresponds to the negative representation of the first Gray code RSTG, the sign determination bit SDB may have a logic high level (e.g., "1") during the first duration.

During the first duration (e.g., at time t4), the plurality of reset latches 510a and 520a store the first binary code RSTB in response to the second control signal CS2.

Referring to FIGS. 1, 2, 4 and 5B, during the second duration for detecting the image component (e.g., at time t8), the plurality of image latches 210a, 220a, and 230a store the second phase shift code SIGP in response to the first control signal CS1, and output image phase shift bits SP0, SP1, and SP2 of the second phase shift code SIGP.

During the second duration (e.g., after time t8), the signal line L1 outputs the image phase shift bit SP2 as an image Gray bit SG1, and the XOR gate 310a performs the XOR operation on the image phase shift bits SP0 and SP1 to generate an image Gray bit SG0. The XOR gate 420a performs the XOR operation on the image Gray bit SG1 and the sign determination bit SDB to generate an image binary bit SB1. The XOR gate 410a performs the XOR operation on the image Gray bit SG0 and the image binary bit SB1 to generate an image binary bit SB0. For example, the sign determination bit SDB may have a logic low level (e.g., "0") during the second duration.

To generate the third binary code IB based on a single 1-bit full adder 610, the 1-bit full adder 610 included in the digital CDS circuit according to example embodiments may sequentially receive the first and second binary codes RSTB and SIGB in an order from LSB to MSB. Thus, during the second duration, the switches 460a and 560a are turned on first, and the reset binary bit RB0 and the image binary bit SB0 that respectively correspond to the LSB are provided to the 1-bit full adder 610. The 1-bit full adder 610 may add the image binary bit SB0 to the reset binary bit RB0 to generate an effective image binary bit IB0 that corresponds to an LSB of the third binary code IB.

Referring to FIGS. 1, 2, 4, and 5C, during the second duration (e.g., after an operation of FIG. 5B), the switches 470a and 570a are turned on, and the reset binary bit RB1 and the image binary bit SB1 that respectively correspond to the MSB are provided to the 1-bit full adder 610. The 1-bit full adder 610 adds the image binary bit SB1 to the reset binary bit RB1 to generate an effective image binary bit IB1 that corresponds to an MSB of the third binary code IB.

In the example of FIGS. 5A, 5B, and 5C, the bits RG1, RB1, SG1, and SB1 may correspond to MSBs, and the bits RG0, RB0, SG0, and SB0 may correspond to LSBs.

Figure 6:
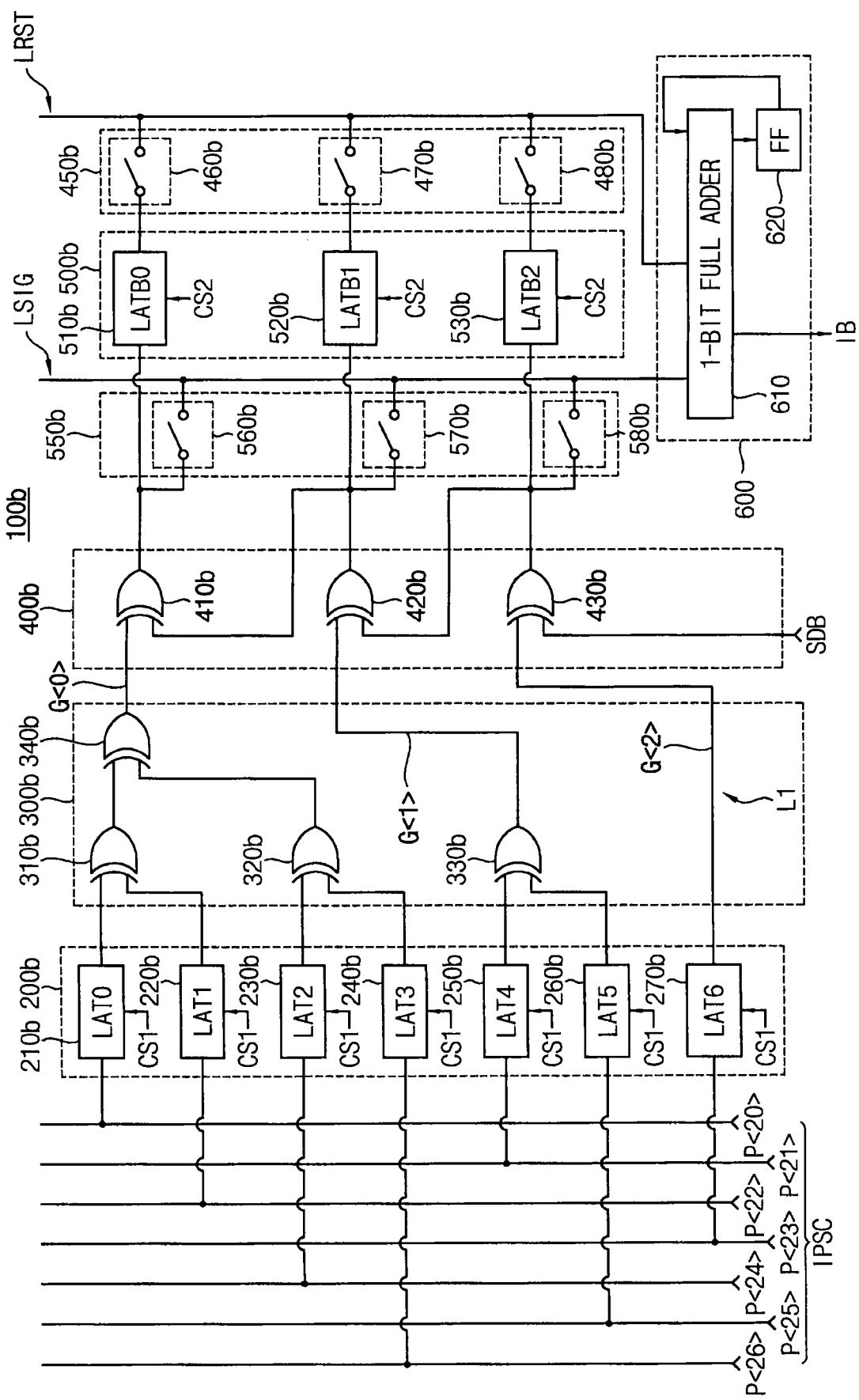
FIG. 6 is a block diagram illustrating another example of the digital CDS circuit of FIG. 1.
Figure 7A:
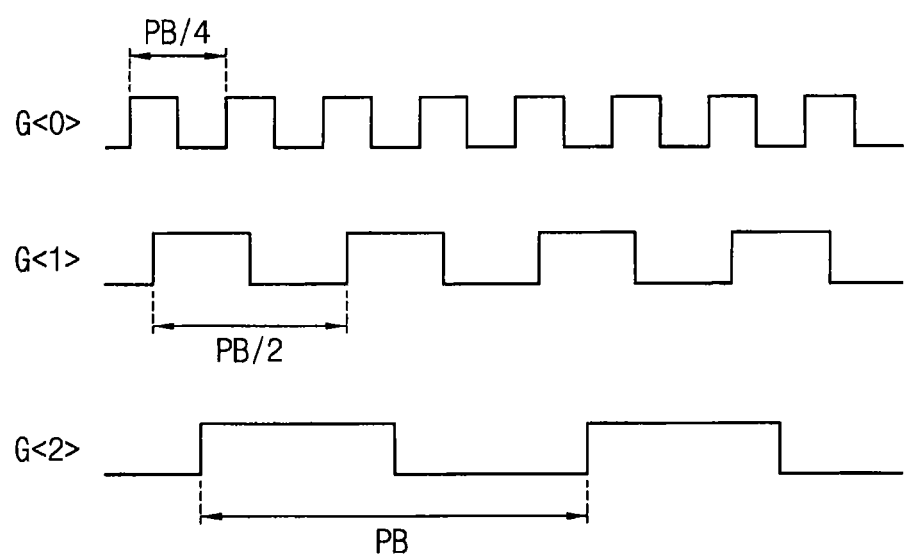
FIGS. 7A, 7B, 8A, and 8B are diagrams describing an operation of the digital CDS circuit of FIG. 6.
Figure 7B:
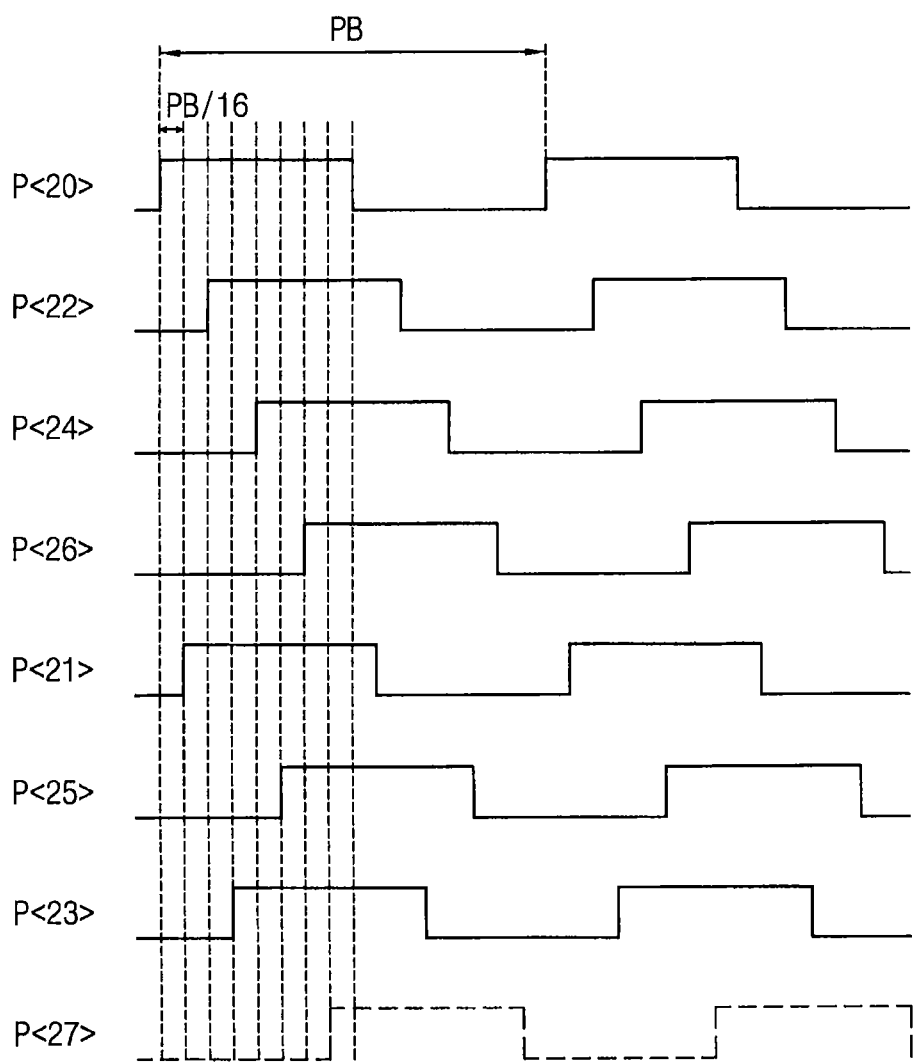

FIG. 6 is a block diagram illustrating another example of the digital CDS circuit of FIG. 1. FIGS. 7A, 7B, 8A, and 8B are diagrams for describing an operation of the digital CDS circuit 100b of FIG. 6. FIG. 7A illustrates waveforms of three Gray signals G<0>, G<1>, and G<2> that are used for generating a 3-bit Gray code. FIG. 7B illustrates waveforms of phase shift signals P<20>, P<21>, P<22>, P<23>, P<24>, P<25>, P<26>, and P<27> that are used in the digital CDS circuit 100b of FIG. 6 and are used for generating the 3-bit Gray code.

Referring to FIGS. 6, 7A, and 7B, a digital CDS circuit 100b includes a first latch circuit 200b, a first converting circuit 300b, a second converting circuit 400b, a second latch circuit 500b, and a calculating circuit 600. The digital CDS circuit 100b may further include a first switch circuit 450b and a second switch circuit 550b.

The digital CDS circuit 100b of FIG. 6 may generate the 3-bit Gray code based on the input phase shift code IPSC that includes seven phase shift signals P<20>, P<21>, P<22>, P<23>, P<24>, P<25>, and P<26> among eight phase shift signals P<20>, P<21>, P<22>, P<23>, P<24>, P<25>, P<26>, and P<27>. The eight phase shift signals P<20>, P<21>, P<22>, P<23>, P<24>, P<25>, P<26>, and P<27> may have the same period, and a phase of each of the eight phase shift signals may partially overlap phases of the others of the eight phase shift signals. In other words, the input phase shift code IPSC that is used in the digital CDS circuit 100b of FIG. 6 may be an 8-phase phase shift code.

The digital CDS circuit 100b of FIG. 6 may be substantially the same as the digital CDS circuit 100a of FIG. 2, except that the number of the phase shift signals included in the input phase shift code IPSC increases, the number of bits of the Gray code increases, and additional XOR gates and switches are used. For example, the first latch circuit 200b may include a plurality of image latches 210b, 220b, 230b, 240b, 250b, 260b, and 270b. The first converting circuit 300b may include a plurality of XOR gates 310b, 320b, 330b, and 340b and a signal line L1. The second converting circuit 400b may include a plurality of XOR gates 410b, 420b, and 430b. The second latch circuit 500b may include a plurality of reset latches 510b, 520b, and 530b. The first switch circuit 450b may include a plurality of switches 460b, 470b, and 480b. The second switch circuit 550b may include a plurality of switches 560b, 570b, and 580b. The calculating circuit 600 may include a 1-bit full adder 610 and a flip-flop 620.

Configurations and operations of the latches 250b, 260b, 270b, 520b, and 530b, the signal line L1, the XOR gates 330b, 420b, and 430b, the switches 470b, 480b, 570b, and 580b, and the calculating circuit 600 in FIG. 6 may be substantially the same as configurations and operations of the latches 210a, 220a, 230a, 510a, and 520a, the signal line L1, the XOR gates 310a, 410a, and 420a, the switches 460a, 470a, 560a, and 570a, and the calculating circuit 600 in FIG. 2, respectively, and thus repeated descriptions are omitted. The latches 210a, 220a, and 510a, and the XOR gates 310a and 410a in FIG. 2 may be used for generating LSBs of the Gray code and the binary code, however, the latches 250b, 260b, and 520b, and the XOR gates 330b and 420b in FIG. 6 may be used for generating central bits (e.g., between the LSB and MSB) of the Gray code and the binary code.

The image latches 210b, 220b, 230b, and 240b may latch the phase shift signals P<20>, P<22>, P<24>, and P<26>, respectively, in response to the first control signal CS1. The XOR gate 310b may perform the XOR operation on phase shift bits that are stored in the image latches 210b and 220b and correspond to the phase shift signals P<20> and P<22>. The XOR gate 320b may perform the XOR operation on phase shift bits that are stored in the image latches 230b and 240b and correspond to the phase shift signals P<24> and P<26>. The XOR gate 340b may perform the XOR operation on an output of the XOR gate 310b and an output of the XOR gate 320b to generate an LSB of the Gray code (e.g., G<0>). The XOR gate 410b may perform the XOR operation on the central bit of the binary code that is output from the XOR gate 420b and the LSB of the Gray code that is output from the XOR gate 340b generate an LSB of the binary code. The reset latch 510b may latch the LSB of the binary code that is output from the XOR gate 410b in response to the second control signal CS2. The switch 460b may selectively connect the reset latch 510b with the reset signal line LRST. The switch 560b may selectively connect the XOR gate 410b with the image signal line LSIG.

As illustrated in FIG. 7A, the Gray signals G<0>, G<1>, and G<2> for generating the 3-bit Gray code may have different periods. For example, the Gray signal G<2> for generating the MSB of the 3-bit Gray code may have a period of "PB," the Gray signal G<1> for generating the central bit of the 3-bit Gray code may have a period of about a half of "PB" (e.g., "PB/2"), and the Gray signal G<0> for generating the LSB of the 3-bit Gray code may have a period of about a quarter of "PB" (e.g., "PB/4"). In other words, a frequency of the Gray signal G<0> may be four times a frequency of the Gray signal G<2>.

As illustrated in FIG. 7B, the phase shift signals P<20>, P<21>, P<22>, P<23>, P<24>, P<25>, P<26>, and P<27> for generating the 3-bit Gray code may have the same period. For example, a period of each of the phase shift signals P<20>, P<21>, P<22>, P<23>, P<24>, P<25>, P<26>, and P<27> may be "PB," which is substantially equal to the period of the Gray signal G<2> for generating the MSB of the 3-bit Gray code. A phase of each of the phase shift signals P<20>, P<21>, P<22>, P<23>, P<24>, P<25>, P<26>, and P<27> may partially overlap phases of the others of the phase shift signals P<20>, P<21>, P<22>, P<23>, P<24>, P<25>, P<26>, and P<27>, and a phase difference between two adjacent (see FIG. 6) phase shift signals (e.g., the phase shift signals P<20> and P<21>) may be "PB/16." In addition, the phase shift signal P<27> is not used in the digital CDS circuit 100b of FIG. 6, and thus the phase shift signal P<27> is illustrated by a dotted line in FIG. 7B. FIG. 7B illustrates the phase shift signals P<20>, P<21>, P<22>, P<23>, P<24>, P<25>, P<26>, and P<27> arranged next to each other in a way that assists in understanding the operations of the digital CDS circuit 100b of FIG. 6. It should be noted that ones of the the phase shift signals P<20>, P<21>, P<22>, P<23>, P<24>, P<25>, P<26>, and P<27> next to one another in FIG. 7B may not be adjacent one another in the arrangement of the the phase shift signals P<20>, P<21>, P<22>, P<23>, P<24>, P<25>, P<26>, and P<27> of FIG. 6.

As described with reference to FIGS. 6, 7A, and 7B, the phase shift bit that corresponds to the phase shift signal P<23> may be output as the MSB of the Gray code because the Gray signal G<2> and the phase shift signal P<23> have the same waveform. In addition, the central bit of the Gray code may be generated by performing the XOR operation on the phase shift bits that correspond to the phase shift signals P<21> and P<25> because the Gray signal G<1> and a signal that is generated by performing the XOR operation on the phase shift signals P<21> and P<25> have the same waveform. The phase of the phase shift signal P<21> may lead the phase of the phase shift signal P<23>, and the phase of the phase shift signal P<25> may lag the phase of the phase shift signal P<23>. Further, the LSB of the Gray code may be generated by performing the XOR operation on the phase shift bits that correspond to the phase shift signals P<20>, P<22>, P<24>, and P<26> because the Gray signal G<0> and a signal that is generated by performing the XOR operation on the phase shift signals P<20>, P<22>, P<24>, and P<26> have the same waveform. The phases of the phase shift signals P<20> and P<22> may lead the phase of the phase shift signal P<23>, and the phases of the phase shift signals P<24> and P<26> may lag the phase of the phase shift signal P<23>.

The digital CDS circuit 100b according to example embodiments may operate based on the phase shift signals P<20>, P<21>, P<22>, P<23>, P<24>, P<25>, and P<26> having a relatively low frequency, and may have an output and/or a calculating result substantially the same as that of a conventional digital CDS circuit operating based on the Gray signals G<0>, G<1>, and G<2>. In an example of FIGS. 6, 7A, and 7B, a frequency of each of the phase shift signals P<20>, P<21>, P<22>, P<23>, P<24>, P<25>, and P<26> may be about a quarter of a frequency of the Gray signal G<0>.

Referring to FIGS. 1, 4, 6, and 8A, during the first duration for detecting the reset component, reset phase shift bits RP0, RP1, RP2, RP3, RP4, RP5, and RP6, reset Gray bits RG0, RG1, and RG2, and reset binary bits RB0, RB1, and RB2 may be sequentially stored, calculated and output.

Referring to FIGS. 1, 4, 6, and 8B, during the second duration for detecting the image component, image phase shift bits SP0, SP1, SP2, SP3, SP4, SP5, and SP6, image Gray bits SG0, SG1, and SG2, and image binary bits SB0, SB1, and SB2 may be sequentially stored, calculated and output. After then, bits of the first and second binary codes RSTB and SIGB may be provided bit by bit to the 1-bit full adder 610 in an order from LSB to MSB, and then the 1-bit full adder 610 may generate the third binary code IB bit by bit.

Figure 8A:
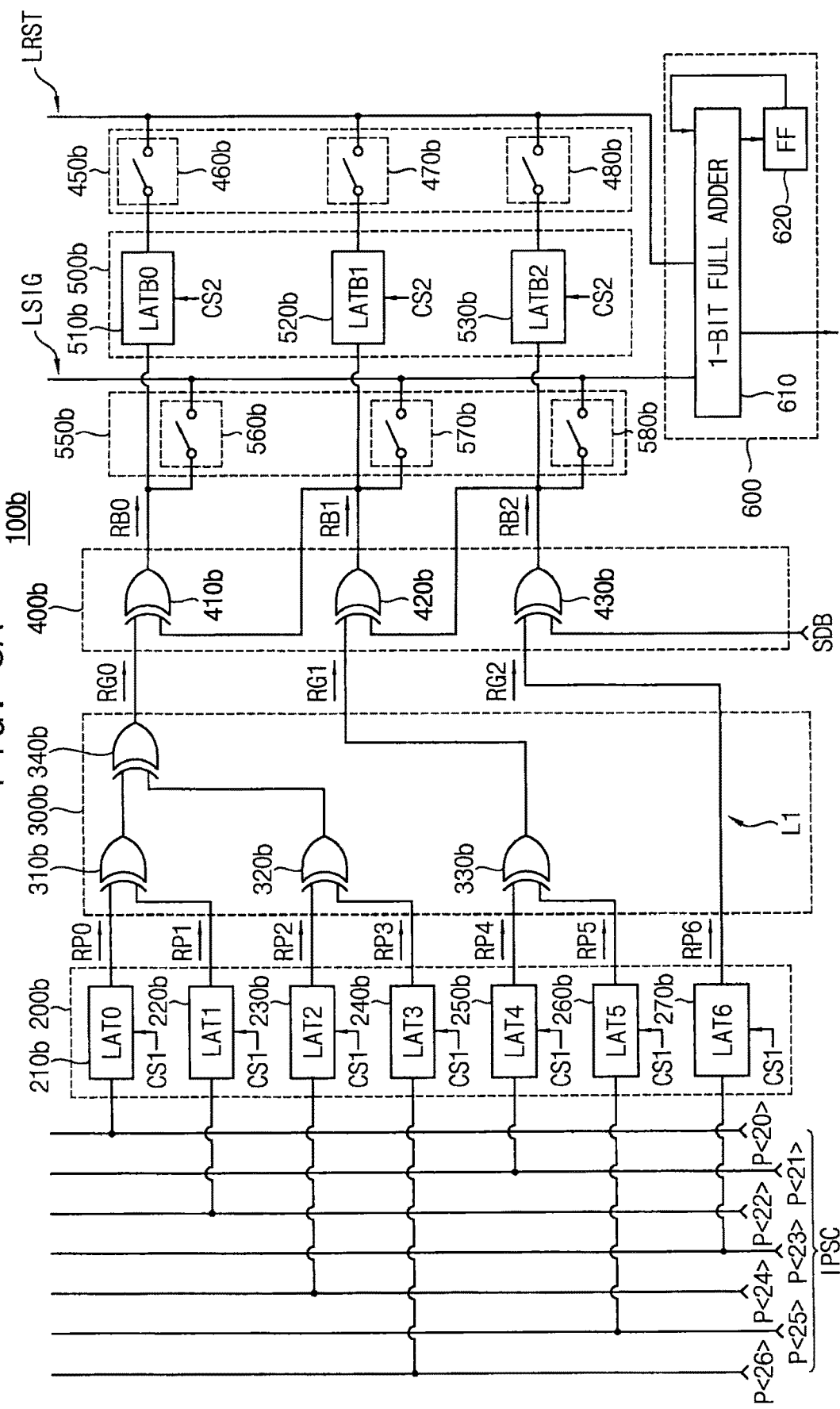
Figure 8B:
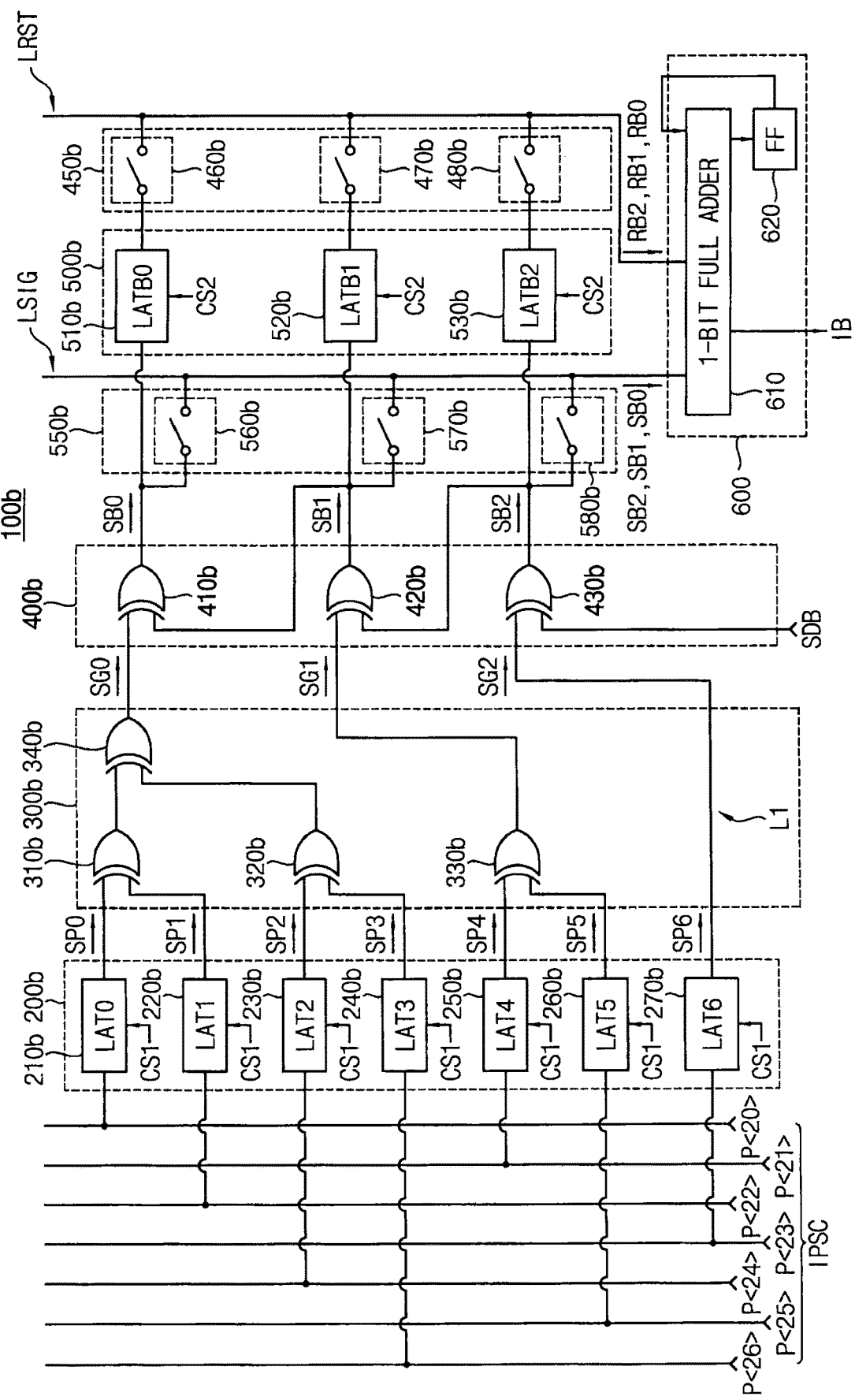

An operation of FIGS. 8A and 8B may be substantially the same as the operation of FIGS. 5A, 5B, and 5C, and thus repeated descriptions are omitted. In an example of FIGS. 8A and 8B, the bits RG2, RB2, SG2, and SB2 may respectively correspond to the MSB, the bits RG1, RB1, SG1, and SB1 may respectively correspond to the central bit, and the bits RG0, RB0, SG0, and SB0 may respectively correspond to the LSB.

Figure 9:
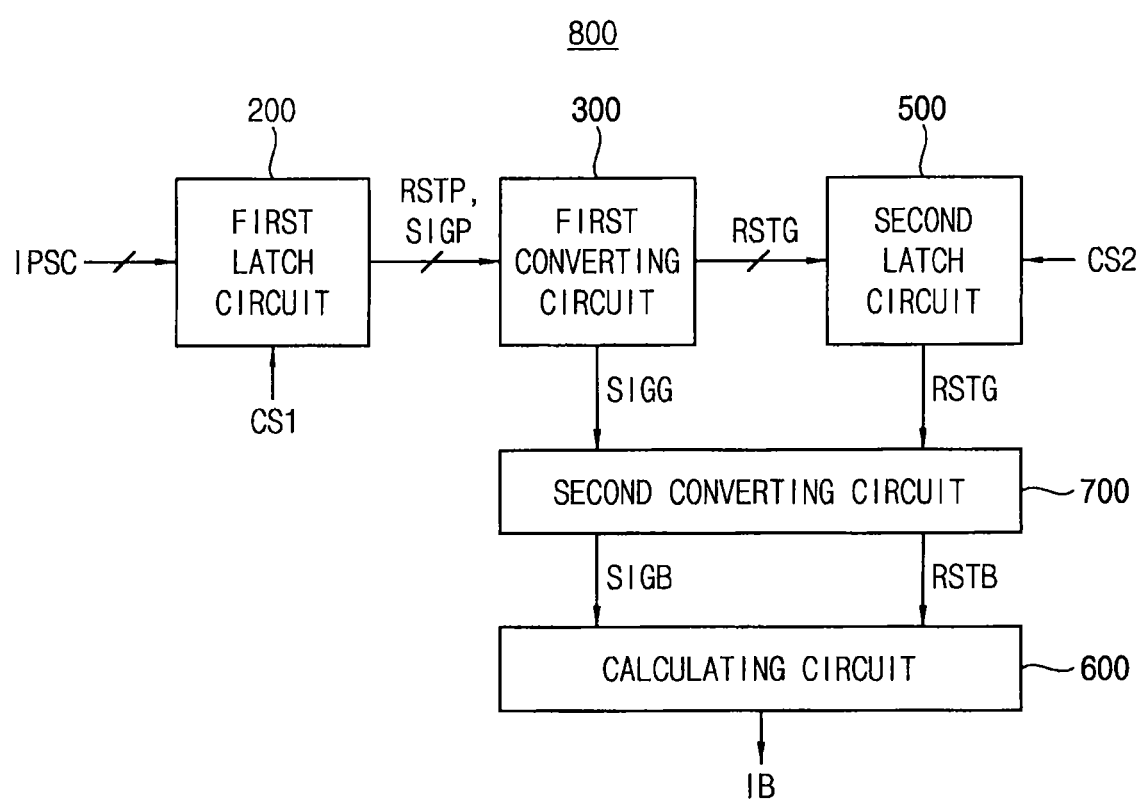
FIG. 9 is a block diagram illustrating a digital CDS circuit according to example embodiments.

FIG. 9 is a block diagram illustrating a digital CDS circuit 800 according to example embodiments of the inventive concepts.

Referring to FIG. 9, a digital CDS circuit 800 may include a first latch circuit 200, a first converting circuit 300, a second latch circuit 500, a second converting circuit 700, and a calculating circuit 600.

The digital CDS circuit 800 of FIG. 9 may be substantially the same as the digital CDS circuit 100 of FIG. 1, except that an arrangement and a configuration of the second converting circuit 700 are changed, and an operation of the second latch circuit 500 is changed. Thus, repeated descriptions are omitted.

The second latch circuit 500 may latch an output of the first converting circuit 300 based on a second control signal CS2 to store the first Gray code RSTG.

The second converting circuit 700 may convert the first Gray code RSTG and the second Gray code SIGG into the first binary code RSTB and the second binary code SIGB, respectively. Unlike the second converting circuit 400 in FIG. 1, the second converting circuit 700 may sequentially convert the first Gray code RSTG and the second Gray code SIGG into the first binary code RSTB and the second binary code SIGB bit by bit.

Figure 10:
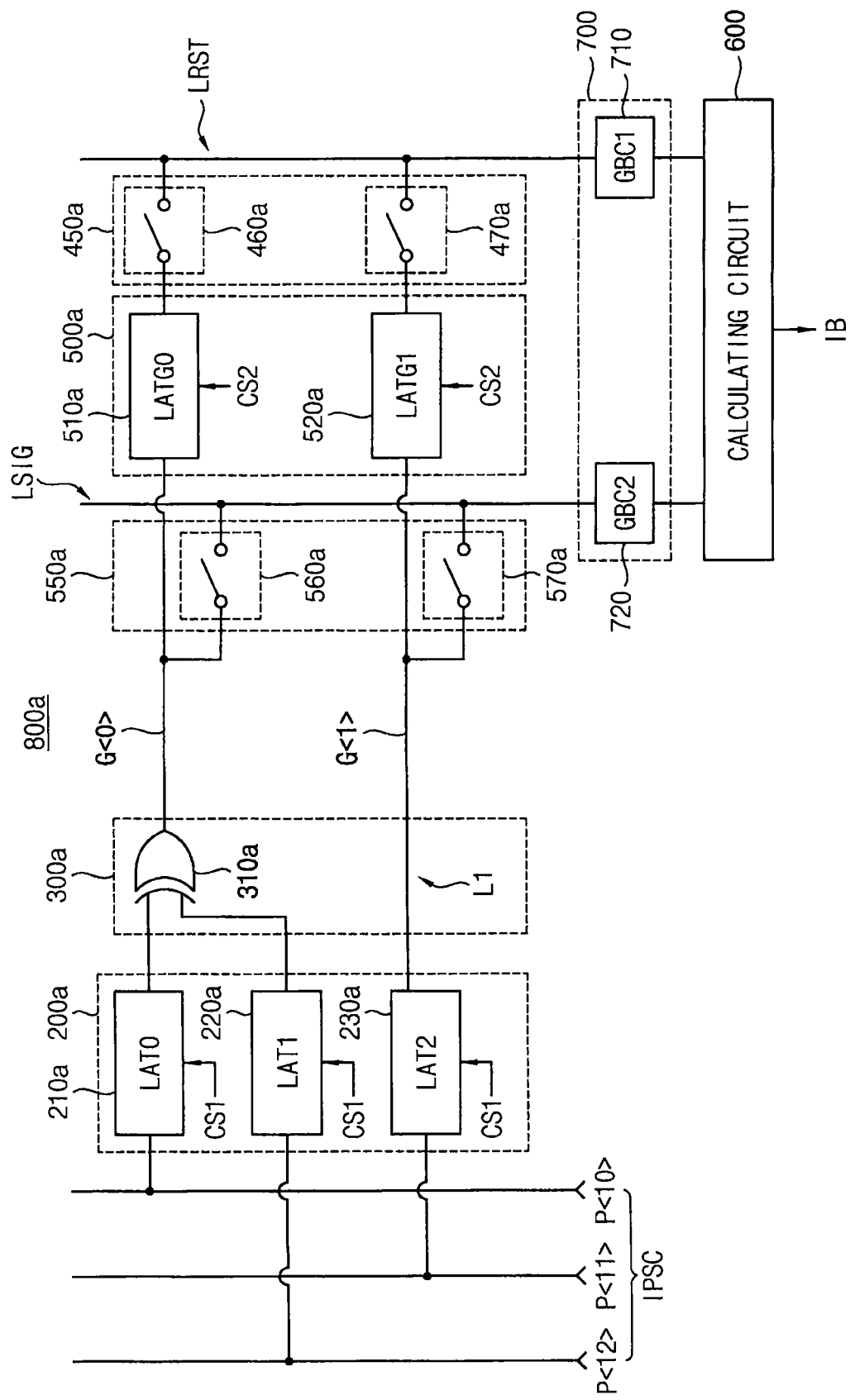
FIG. 10 is a block diagram illustrating an example of the digital CDS circuit of FIG. 9.

FIG. 10 is a block diagram illustrating an example of the digital CDS circuit 800 of FIG. 9.

Referring to FIG. 10, a digital CDS circuit 800a may include a first latch circuit 200a, a first converting circuit 300a, a second latch circuit 500a, a second converting circuit 700, and a calculating circuit 600. The first latch circuit 200a, first converting circuit 300a, second latch circuit 500a, second converting circuit 700, and calculating circuit 600 of FIG. 10 may be the same or similar to the first latch circuit 200, first converting circuit 300, second latch circuit 500, second converting circuit 700, and calculating circuit 600 illustrated in FIG. 9. The digital CDS circuit 800a may further include a first switch circuit 450a and a second switch circuit 550a.

The first latch circuit 200a, the first converting circuit 300a, the second latch circuit 500a, the calculating circuit 600, the first switch circuit 450a, and the second switch circuit 550a in FIG. 10 may be substantially the same as the first latch circuit 200a, the first converting circuit 300a, the second latch circuit 500a, the calculating circuit 600, the first switch circuit 450a, and the second switch circuit 550a in FIG. 2, respectively, and thus repeated descriptions are omitted.

The second converting circuit 700 may include a first Gray-to-binary converter 710 and a second Gray-to-binary converter 720. The first Gray-to-binary converter 710 may be connected to the reset signal line LRST, and may convert the first Gray code RSTG into the first binary code RSTB bit by bit. The second Gray-to-binary converter 720 may be connected to the image signal line LSIG, and may convert the second Gray code SIGG into the second binary code SIGB bit by bit.

The first switch circuit 450a may sequentially provide the first Gray code RSTG that is stored in the second latch circuit 500a to the first Gray-to-binary converter 710 bit by bit over the reset signal line LRST. The second switch circuit 550a may sequentially provide the second Gray code SIGG that is output from the first converting circuit 300a to the second Gray-to-binary converter 720 bit by bit over the image signal line LSIG.

Figure 11A:
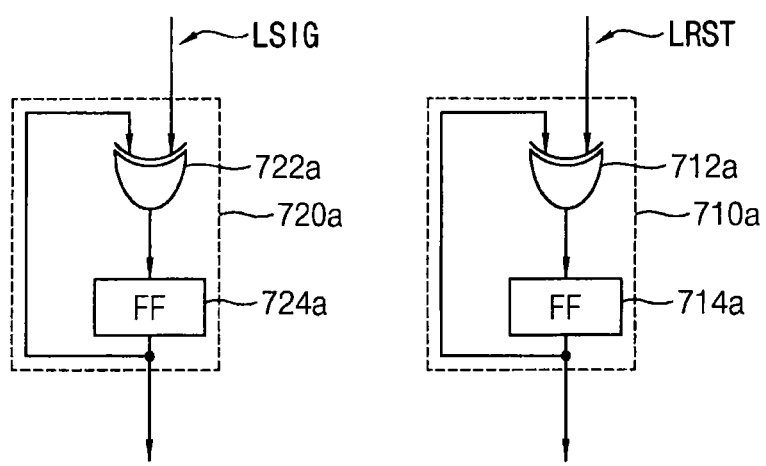
FIGS. 11A and 11B are block diagrams illustrating examples of a second converting circuit included in the digital CDS circuit of FIG. 10.
Figure 11B:
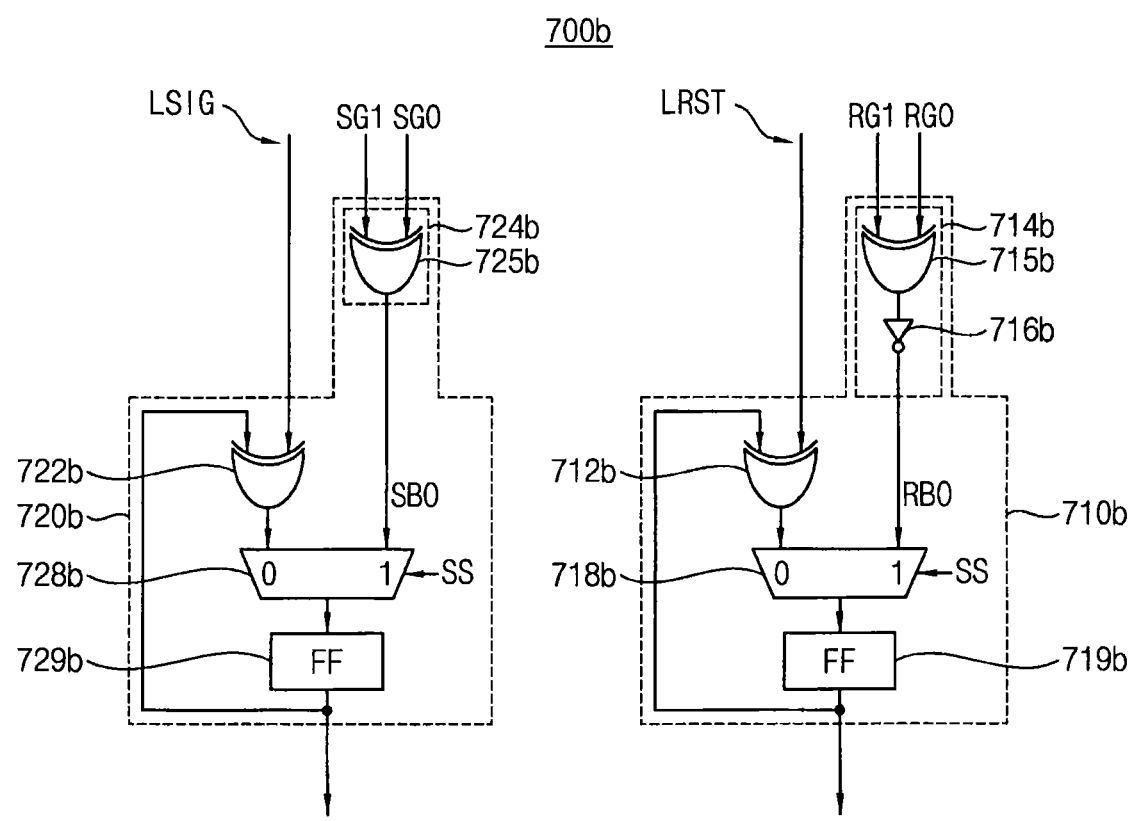

FIGS. 11A and 11B are block diagrams illustrating examples of a second converting circuit 700 included in the digital CDS circuit of FIG. 10.

Referring to FIG. 11A, a second converting circuit 700a may include a first Gray-to-binary converter 710a and a second Gray-to-binary converter 720a.

The first Gray-to-binary converter 710a may include a first XOR gate 712a and a first flip-flop 714a. The first XOR gate 712a may perform the XOR operation on one bit of the first Gray code RSTG from the reset signal line LRST and an output of the first flip-flop 714a to generate one bit of the first binary code RSTB. The first flip-flop 714a may store a first initial value at an initial operation time of the digital CDS circuit 800a, and then may sequentially store an output of the first XOR gate 712a. For example, the first initial value may be "1."

The second Gray-to-binary converter 720a may include a second XOR gate 722a and a second flip-flop 724a. A configuration of the second Gray-to-binary converter 720a may be substantially the same as a configuration of the first Gray-to-binary converter 710a, with the exception that the second XOR gate 722a performs an XOR operation on one bit of the second Gray code SIGG from the image signal line LSIG. The second flip-flop 724a may store a second initial value at the initial operation time of the digital CDS circuit 800a, and the second initial value may be different from the first initial value. For example, the second initial value may be "0."

In some example embodiments, when the second converting circuit 700 in FIG. 10 is implemented with the second converting circuit 700a of FIG. 11A, the first and second switch circuits 450a and 550a in FIG. 10 may be controlled to sequentially output the first and second Gray codes RSTG and SIGG in an order from MSB to LSB, and then to sequentially output the first and second Gray codes RSTG and SIGG in an order from LSB to MSB.

Referring to FIG. 11B, a second converting circuit 700b may include a first Gray-to-binary converter 710b and a second Gray-to-binary converter 720b.

The first Gray-to-binary converter 710b may include a first XOR gate 712b, a first binary bit generator 714b, a first multiplexer 718b, and a first flip-flop 719b. The first binary bit generator 714b may perform the XOR operation on all bits (e.g., RG0 and RG1) of the first Gray code RSTG to generate a first binary bit (e.g., RB0 corresponding to the LSB) of the first binary code RSTB. The first binary bit generator 714b may include an XOR gate 715b and an inverter 716b. The first multiplexer 718b may select one of an output of the first XOR gate 712b and an output of the first binary bit generator 714b based on a selection signal SS. The first flip-flop 719b may store an output of the first multiplexer 718b. The first XOR gate 712b may perform the XOR operation on one bit of the first Gray code RSTG and an output of the first flip-flop 719b to generate one bit of the first binary code RSTB other than the first binary bit.

The second Gray-to-binary converter 720b may include a second XOR gate 722b, a second binary bit generator 724b, a second multiplexer 728b and a second flip-flop 729b. A configuration of the second Gray-to-binary converter 720b may be substantially the same as a configuration of the first Gray-to-binary converter 710b, except that the second binary bit generator 724b includes only an XOR gate 725b.

In some example embodiments, when the second converting circuit 700 in FIG. 10 is implemented with the second converting circuit 700b of FIG. 11B, the first and second switch circuits 450a and 550a in FIG. 10 may be controlled to substantially simultaneously or concurrently output all bits of the first and second Gray codes RSTG and SIGG and then to sequentially output bits of the first and second Gray codes RSTG and SIGG in an order from LSB to MSB.

Figure 12:
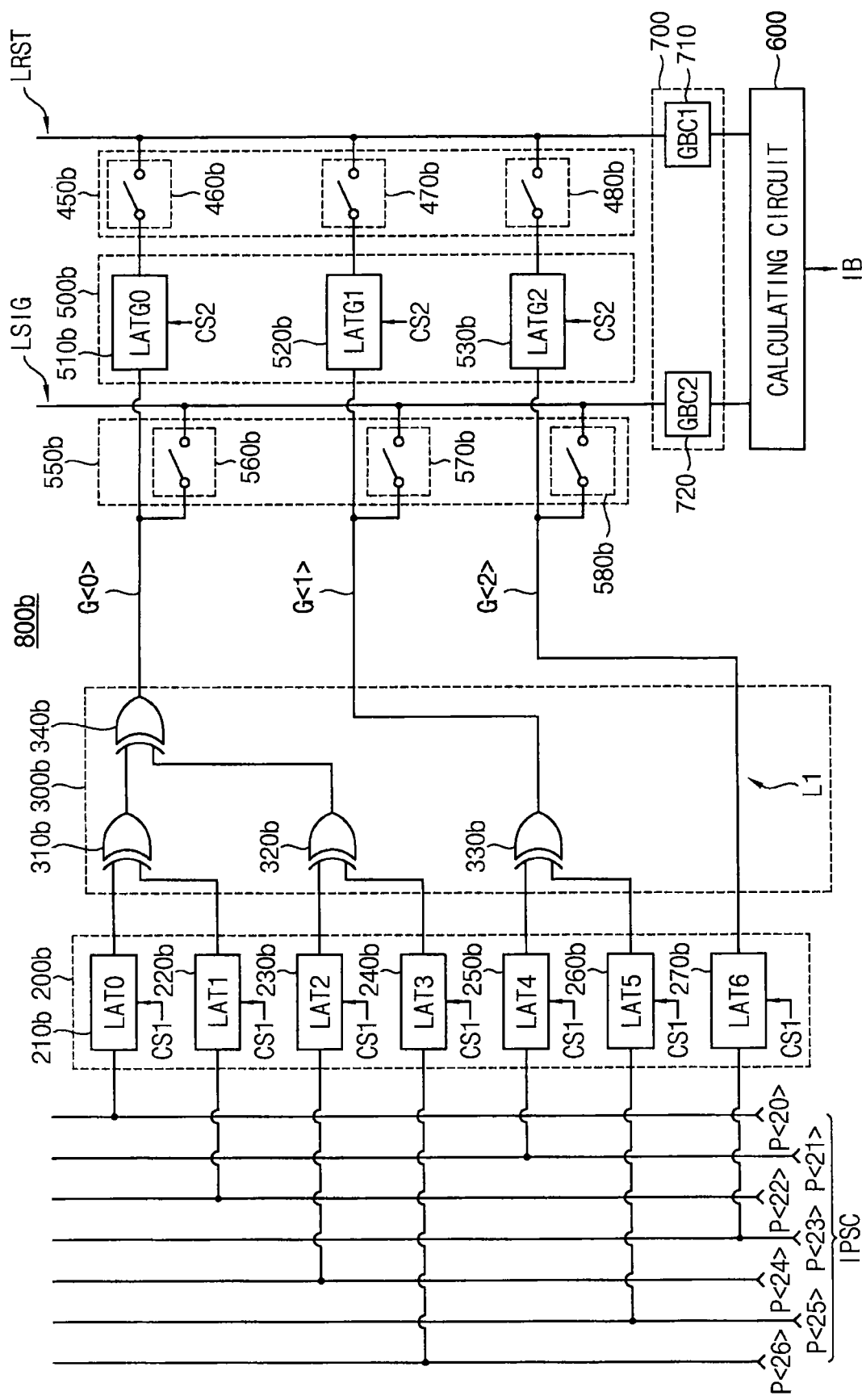
FIG. 12 is a block diagram illustrating another example of the digital CDS circuit of FIG. 9.

FIG. 12 is a block diagram illustrating another example of the digital CDS circuit 800 of FIG. 9.

Referring to FIG. 12, a digital CDS circuit 800b includes a first latch circuit 200b, a first converting circuit 300b, a second latch circuit 500b, a second converting circuit 700, and a calculating circuit 600. The first latch circuit 200b, first converting circuit 300b, second latch circuit 500b, second converting circuit 700, and calculating circuit 600 of FIG. 12 may be the same or similar to the first latch circuit 200, first converting circuit 300, second latch circuit 500, second converting circuit 700, and calculating circuit 600 illustrated in FIG. 9. The digital CDS circuit 800b may further include a first switch circuit 450b and a second switch circuit 550b.

The first latch circuit 200b, the first converting circuit 300b, the second latch circuit 500b, the calculating circuit 600, the first switch circuit 450b, and the second switch circuit 550b in FIG. 12 may be substantially the same as the first latch circuit 200b, the first converting circuit 300b, the second latch circuit 500b, the calculating circuit 600, the first switch circuit 450b, and the second switch circuit 550b in FIG. 6, respectively. The second converting circuit 700 in FIG. 12 may be substantially the same as the second converting circuit 700 in FIG. 10. Thus, repeated descriptions are omitted.

As described with reference to FIGS. 9 through 12, when the second converting circuit 700 is disposed at a later stage of the second latch circuit 500, the second converting circuit 700 may not become more complex even if the number of bits of the Gray code increases.

Although the example embodiments are described with reference to FIGS. 1 through 12 and based on the 4-phase phase shift code or the 8-phase phase shift code, the example embodiments may be employed in an example based on a $2^n$-phase phase shift code. For example, the input phase shift code IPSC may include first through ($2^n-1$)-th phase shift signals each of which has a first period. A phase of each of the first through ($2^n-1$)-th phase shift signals may partially overlap phases of the others of the first through ($2^n-1$)-th phase shift signals. A phase difference between two adjacent phase shift signals among the first through ($2^n-1$)-th phase shift signals may be substantially equal to 1/(2*n) of the first period. In addition, the first latch circuit may include ($2^n-1$) image latches, the second latch circuit may include n reset latches, and the first and second converting circuits may include a plurality of XOR gates.

Figure 13:
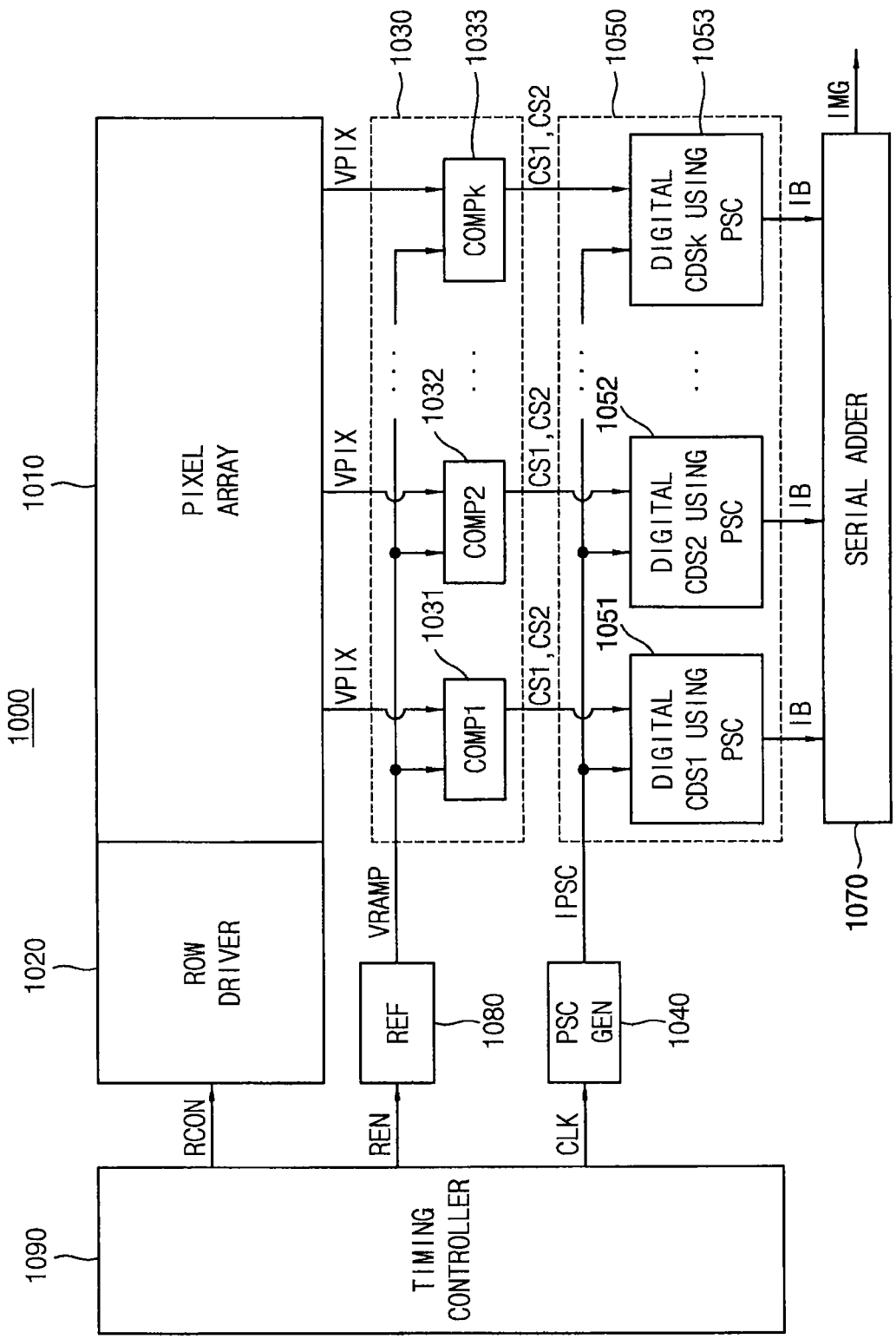
FIG. 13 is a block diagram illustrating an image sensor including the digital CDS circuit according to example embodiments of the inventive concepts.

FIG. 13 is a block diagram illustrating an image sensor including the digital CDS circuit according to example embodiments of the inventive concepts.

Referring to FIG. 13, an image sensor 1000 includes a pixel array 1010, a comparison block 1030 and a digital CDS block 1050. The image sensor 1000 may further include a row driver 1020, a phase shift code generator 1040, a serial adder 1070, a voltage generator 1080 and a timing controller 1090.

The pixel array 1010 generates a plurality of analog pixel signals VPIX based on incident light. The pixel array 1010 may include a plurality of unit pixels that are arranged in a matrix of a plurality of rows and a plurality of columns.

Figure 14:
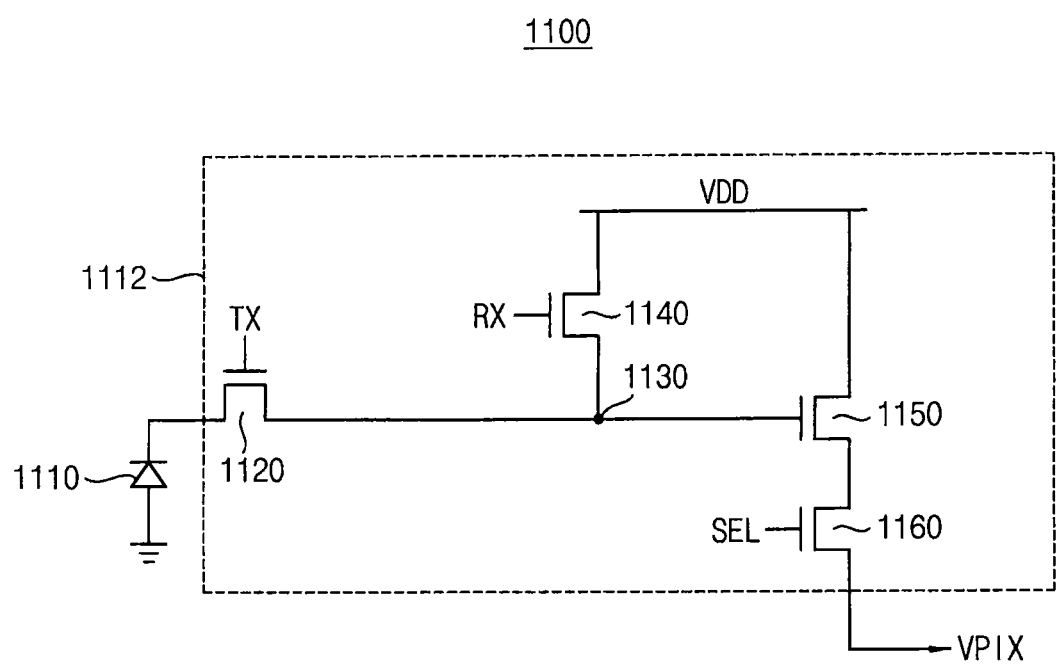
FIG. 14 is a circuit diagram illustrating an example of a unit pixel included in the image sensor of FIG. 13.

FIG. 14 is a circuit diagram illustrating an example of a unit pixel included in the image sensor of FIG. 13.

Referring to FIG. 14, a unit pixel 1100 may include a photoelectric conversion unit 1110 and a signal generation unit 1112.

The photoelectric conversion unit 1110 may perform a photoelectric conversion operation. For example, the photoelectric conversion unit 1110 may convert the incident light into photo-charges during an integration mode. If an image sensor including the unit pixel 1100 is a CMOS image sensor, image information on an object to be captured may be obtained by collecting charge carriers (e.g., electron-hole pairs) in the photoelectric conversion unit 1110 proportional to intensity of the incident light through an open shutter of the CMOS image sensor during the integration mode.

The signal generation unit 1112 may generate an electric signal (e.g., the analog pixel signal VPIX) based on the photo-charges generated by the photoelectric conversion operation during a readout mode. If the image sensor including the unit pixel 1100 is the CMOS image sensor, the shutter may be closed, and the analog pixel signal VPIX may be generated based on the image information in a form of the charge carriers during the readout mode after the integration mode. For example, as illustrated in FIG. 14, the unit pixel 1100 may have four-transistor structure.

For example, the signal generation unit 1112 may include a transfer transistor 1120, a reset transistor 1140, a drive transistor 1150, a selection transistor 1160, and a floating diffusion node 1130. The transfer transistor 1120 may be connected between the photoelectric conversion unit 1110 and the floating diffusion node 1130, and may include a gate electrode receiving a transfer signal TX. The reset transistor 1140 may be connected between a power supply voltage VDD and the floating diffusion node 1130, and may include a gate electrode receiving a reset signal RX. The drive transistor 1150 may be connected between the power supply voltage VDD and the selection transistor 1160, and may include a gate electrode connected to the floating diffusion node 1130. The selection transistor 1160 may be connected between the drive transistor 1150 and an output terminal outputting the analog pixel signal VPIX, and may include a gate electrode receiving a selection signal SEL.

Referring again to FIG. 13, the row driver 1020 may be connected to each row of the pixel array 1010. The row driver 1020 may generate driving signals based on a row control signal RCON to drive each row.

The voltage generator 1080 may generate a ramp signal VRAMP based on a ramp enable signal REN. The phase shift code generator 1040 may generate an input phase shift code IPSC based on a clock signal CLK.

The comparison block 1030 compares the plurality of analog pixel signals VPIX with the ramp signal VRAMP to generate a plurality of first control signals CS1 and a plurality of second control signals CS2. The comparison block 1030 may include a plurality of comparators 1031, 1032, and 1033. Each of the plurality of comparators 1031, 1032, and 1033 may be connected to each column of the pixel array 1010.

The digital CDS block 1050 performs a digital CDS based on the plurality of first control signals CS1, the plurality of second control signals CS2, and an input phase shift code IPSC to generate a plurality of effective image binary codes IB that correspond to the plurality of analog pixel signals VPIX. The digital CDS block 1050 may include a plurality of digital CDS circuits 1051, 1052, and 1053. Each of the plurality of digital CDS circuits 1051, 1052, and 1053 may be connected to a respective one of the plurality of comparators 1031, 1032, and 1033.

Each of the plurality of digital CDS circuits 1051, 1052, and 1053 may be a digital CDS circuit according to example embodiments described with reference to FIGS. 1 through 12. For example, each digital CDS circuit may include a first latch circuit, a first converting circuit, a second latch circuit, a second converting circuit, and a calculating circuit. The second converting circuit may be disposed between the first converting circuit and the second latch circuit, or may be disposed between the second latch circuit and the calculating circuit. In each column (e.g., in each digital CDS circuit), the effective image binary code IB may be generated by sequentially converting the phase shift code into the Gray code, and converting the Gray code into the binary code. A relatively precise and/or detailed representation may be implemented with phase shift signals having a relatively low frequency, and thus power consumption may be reduced.

The serial adder 1070 may add the plurality of effective image binary codes IB to each other to generate image data IMG.

The timing controller 1090 may control overall operations of the image sensor 1000. For example, the timing controller 1090 may generate the row control signal RCON, the ramp enable signal REN, the clock signal CLK, etc.

Figure 15:
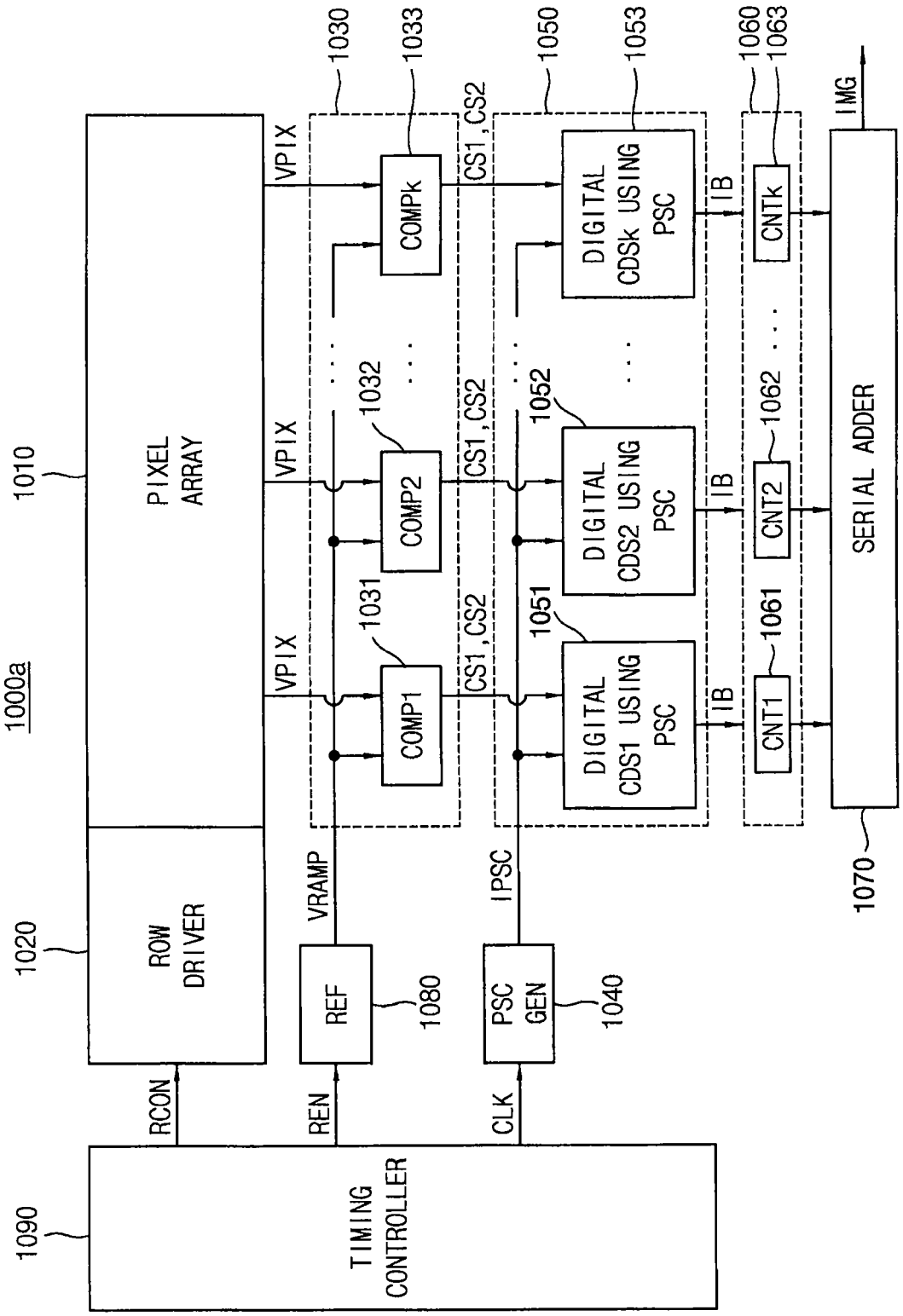
FIG. 15 is a block diagram illustrating an image sensor including the digital CDS circuit according to example embodiments of the inventive concepts.

FIG. 15 is a block diagram illustrating an image sensor including the digital CDS circuit according to example embodiments of the inventive concepts.

Referring to FIG. 15, an image sensor 1000a may include a pixel array 1010, a comparison block 1030, and a digital CDS block 1050. The image sensor 1000a may further include a row driver 1020, a phase shift code generator 1040, a counter block 1060, a serial adder 1070, a voltage generator 1080, and a timing controller 1090.

The image sensor 1000a of FIG. 15 may be substantially the same as the image sensor 1000 of FIG. 13, except that the image sensor 1000a may further include the counter block 1060.

The counter block 1060 may be disposed between the digital CDS block 1050 and the serial adder 1070. The counter block 1060 may include a plurality of counters 1061, 1062, and 1063. Each of the plurality of counters 1061, 1062, and 1063 may be connected to a respective one of the plurality of digital CDS circuits 1051, 1052, and 1053.

In the example of FIG. 15, the plurality of effective image binary codes IB that are generated by the plurality of digital CDS circuits 1051, 1052, and 1053 may correspond to LSB parts of total effective image components, and a plurality of binary codes that are output from the plurality of counters

1061, 1062, and 1063 may correspond to MSB parts of the total effective image components. In other words, the digital CDS block 1050 may be used for generating the LSB parts of the total effective image components, and the counter block 1060 may be used for generating the MSB parts of the total effective image components.

The serial adder 1070 may add outputs of the counter block 1060 to each other to generate image data IMG.

Figure 16:
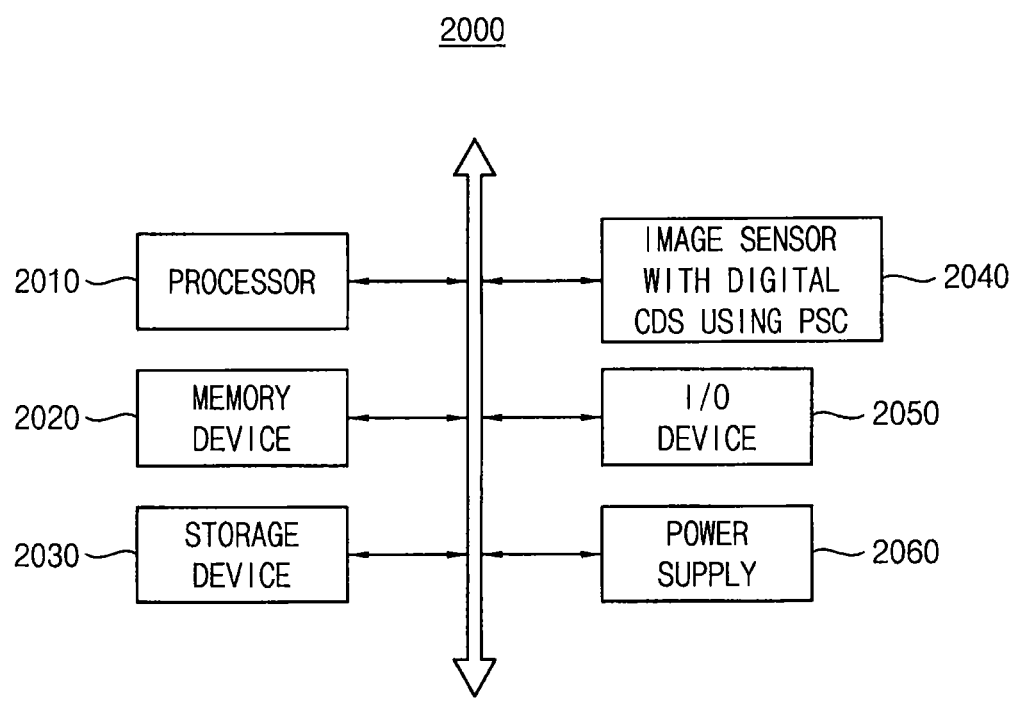
FIG. 16 is a block diagram illustrating a computing system including the image sensor according to example embodiments of the inventive concepts.

FIG. 16 is a block diagram illustrating a computing system 2000 including the image sensor 2040 according to example embodiments of the inventive concepts.

Referring to FIG. 16, a computing system 2000 may include a processor 2010, a memory device 2020, a storage device 2030, an image sensor 2040, an input/output (I/O) device 2050, and a power supply 2060.

The processor 2010 may perform various calculations or tasks for operating the computing system 2000. For example, the processor 2010 may include a microprocessor, a central processing unit (CPU), an application processor (AP), etc. The memory device 2020 and/or the storage device 2030 may store data for operating the computing system 2000. For example, the memory device 2020 may include a volatile memory device and/or a nonvolatile memory device, and the storage device 2030 may include a solid state drive (SSD), a hard disk drive (HDD), a CD-ROM, etc. The I/O device 2050 may include an input device (e.g., a keyboard, a keypad, a mouse, etc.) and/or an output device (e.g., a printer, a display device, etc.). The power supply 2060 may supply operation voltages for the computing system 2000.

The image sensor 2040 may include a digital CDS circuit according to example embodiments of the inventive concepts described herein. A relatively precise and/or detailed representation may be implemented with phase shift signals having a relatively low frequency, and thus power consumption may be reduced.

The inventive concepts may be applied to various devices and systems that include the image sensor including the digital CDS circuit. For example, the inventive concepts may be applied to systems such as a mobile phone, a smart phone, a tablet computer, a laptop computer, a personal digital assistants (PDA), a portable multimedia player (PMP), a digital camera, a portable game console, a music player, a camcorder, a video player, a navigation device, a wearable device, an internet of things (IoT) device, an internet of everything (IoE) device, an e-book, a virtual reality (VR) device, an augmented reality (AR) device, a robotic device, etc.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items. Expressions such as "at least one of;" when preceding a list of elements, modify the entire list of elements and do not modify the individual elements of the list.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A digital correlated double sampling (CDS) circuit comprising:

a first latch circuit configured to latch an input phase shift code based on a first control signal to sequentially store a first phase shift code and a second phase shift code, the first phase shift code representing a reset component, the second phase shift code representing an image component;

a first converting circuit configured to convert the first phase shift code representing the reset component into a first Gray code and the second phase shift code representing the image component into a second Gray code;

a second converting circuit configured to convert the first Gray code and the second Gray code into a first binary code and a second binary code, respectively;

a second latch circuit configured to latch an output of the second converting circuit based on a second control signal to store the first binary code; and a calculating circuit configured to subtract the reset component from the image component based on the first binary code and the second binary code to generate a third binary code, and to sequentially output the third binary code, the third binary code representing an effective image component, wherein the input phase shift code comprises a plurality of phase shift signals having a same period, and wherein at least one bit of the first Gray code is generated based on at least two of the plurality of phase shift signals.

2. The digital CDS circuit of claim 1, wherein a respective phase of each of the plurality of phase shift signals partially overlaps phases of others of the plurality of phase shift signals, wherein a least significant bit (LSB) of the first Gray code and an LSB of the second Gray code are generated based on the at least two of the plurality of phase shift signals, and wherein a most significant bit (MSB) of the first Gray code and an MSB of the second Gray code are generated based on one of the plurality of phase shift signals.

3. The digital CDS circuit of claim 2, wherein the plurality of phase shift signals comprises a first phase shift signal, a second phase shift signal, and a third phase shift signal, wherein the first converting circuit comprises:

a first signal line configured to output a first phase shift bit corresponding to the first phase shift signal as a first Gray bit corresponding to the MSB of the first Gray code and/or the second Gray code; and a first XOR gate configured to perform an XOR operation on a second phase shift bit corresponding to the second phase shift signal and a third phase shift bit corresponding to the third phase shift signal to generate a second Gray bit of the first Gray code and/or the second Gray code.

4. The digital CDS circuit of claim 3, wherein the second converting circuit includes:

a second XOR gate configured to perform an XOR operation on the first Gray bit and a sign determination bit to generate a first binary bit; and a third XOR gate configured to perform an XOR operation on the second Gray bit and the first binary bit to generate a second binary bit.

5. The digital CDS circuit of claim 4, wherein the first signal line outputs a first reset Gray bit corresponding to the MSB of the first Gray code during a first duration for detecting the reset component, wherein the first XOR gate generates a second reset Gray bit of the first Gray code during the first duration, wherein the second XOR gate generates a first reset binary bit of the first binary code during the first duration, and wherein the third XOR gate generates a second reset binary bit of the first binary code during the first duration.

6. The digital CDS circuit of claim 5, wherein the first signal line outputs a first image Gray bit corresponding to the MSB of the second Gray code during a second duration for detecting the image component, wherein the first XOR gate generates a second image Gray bit of the second Gray code during the second duration, wherein the second XOR gate generates a first image binary bit of the second binary code during the second duration, and wherein the third XOR gate generates a second image binary bit of the second binary code during the second duration.

7. The digital CDS circuit of claim 6, wherein the sign determination bit has a logic high level during the first duration, wherein the sign determination bit has a logic low level during the second duration.

8. The digital CDS circuit of claim 4, wherein the second latch circuit includes:

a first reset latch configured to latch an output of the second XOR gate in response to the second control signal; and a second reset latch configured to latch an output of the third XOR gate in response to the second control signal.

9. The digital CDS circuit of claim 3, wherein the first latch circuit includes:

a first image latch configured to latch the first phase shift signal in response to the first control signal;

a second image latch configured to latch the second phase shift signal in response to the first control signal; and a third image latch configured to latch the third phase shift signal in response to the first control signal.

10. The digital CDS circuit of claim 2, wherein the plurality of phase shift signals comprises first through ($2^n$−1)-th phase shift signals each of which has a first period, where n is a natural number greater than or equal to two, and wherein a phase difference between two phase shift signals among the first through ($2^n$−1)-th phase shift signals is substantially equal to $1/(2*n)$ of the first period.

11. The digital CDS circuit of claim 1, wherein the first binary code corresponds to a negative representation of the first Gray code, and wherein the calculating circuit comprises:

a 1-bit full adder configured to add the second binary code to the first binary code to generate the third binary code.

12. The digital CDS circuit of claim 11, further comprising:

a first switch circuit configured to sequentially provide the first binary code stored in the second latch circuit to the 1-bit full adder; and a second switch circuit configured to sequentially provide the second binary code output from the second converting circuit to the 1-bit full adder.

13. An image sensor comprising:

a pixel array configured to generate a plurality of analog pixel signals based on incident light;

a comparison block configured to compare the plurality of analog pixel signals with a ramp signal to generate a plurality of first control signals and a plurality of second control signals; and a digital correlated double sampling (CDS) block including a plurality of digital CDS circuits, the digital CDS block configured to perform a digital CDS based on the plurality of first control signals, the plurality of second control signals, and an input phase shift code to generate a plurality of effective image binary codes, wherein each of the plurality of digital CDS circuits comprises:

a first latch circuit configured to latch the input phase shift code based on one of the plurality of first control signals to sequentially store a first phase shift code and a second phase shift code, the first phase shift code representing a reset component, the second phase shift code representing an image component;

a first converting circuit configured to convert the first phase shift code representing the reset component into a first Gray code and the second phase shift code representing the image component into a second Gray code;

a second converting circuit configured to convert the first Gray code and the second Gray code into a first binary code and a second binary code, respectively;

a second latch circuit configured to store the first binary code based on one of the plurality of second control signals; and a calculating circuit configured to subtract the reset component from the image component based on the first binary code and the second binary code to generate a third binary code, and to sequentially output the third binary code, the third binary code representing an effective image component, wherein the input phase shift code comprises a plurality of phase shift signals having a same period, and wherein at least one bit of the first Gray code is generated based on at least two of the plurality of phase shift signals.

14. The image sensor of claim 13, wherein the second converting circuit is coupled between the first converting circuit and the second latch circuit, and wherein the second latch circuit is configured to latch an output of the second converting circuit based on one of the plurality of second control signals to store the first binary code.

15. The image sensor of claim 13, wherein a respective phase of each of the plurality of phase shift signals partially overlaps phases of others of the plurality of phase shift signals, wherein a least significant bit (LSB) of the first Gray code and an LSB of the second Gray code are generated based on the at least two of the plurality of phase shift signals, and wherein a most significant bit (MSB) of the first Gray code and an MSB of the second Gray code are generated based on one of the plurality of phase shift signals.

16. A digital correlated double sampling (CDS) circuit comprising:

a first converting circuit configured to output a first Gray code and a second Gray code based on an input phase shift code that comprises a first phase shift signal, a second phase shift signal, and a third phase shift signal having a same period, the first converting circuit comprising:

a first signal line configured to output a first phase shift bit corresponding to the first phase shift signal as a first Gray bit corresponding to an MSB of the first Gray code and/or the second Gray code; and a first XOR gate configured to perform an XOR operation on a second phase shift bit corresponding to the second phase shift signal and a third phase shift bit corresponding to the third phase shift signal to generate a second Gray bit of the first Gray code and/or the second Gray code;

a second converting circuit configured to convert the first Gray code and the second Gray code into a first binary code and a second binary code, respectively;

a second latch circuit configured to latch an output of the second converting circuit based on a second control signal to store the first binary code; and a calculating circuit configured to subtract a reset component of the input phase shift code from an image component of the input phase shift code based on the first binary code and the second binary code to generate a third binary code, and to sequentially output the third binary code, the third binary code representing an effective image component.

17. The digital CDS circuit of claim 16, wherein the input phase shift code further comprises a fourth phase shift signal, a fifth phase shift signal, a sixth phase shift signal, and a seventh phase shift signal, wherein the first converting circuit further comprises:

a second XOR gate configured to perform an XOR operation on a fourth phase shift bit corresponding to the fourth phase shift signal and a fifth phase shift bit corresponding to the fifth phase shift signal;

a third XOR gate configured to perform an XOR operation on a sixth phase shift bit corresponding to the sixth phase shift signal and a seventh phase shift bit corresponding to the seventh phase shift signal; and a fourth XOR gate configured to perform an XOR operation on an output of the second XOR gate and an output of the third XOR gate to generate a third Gray bit.

18. The digital CDS circuit of claim 17, wherein the second converting circuit comprises:

a fifth XOR gate configured to perform the XOR operation on the first Gray bit and a sign determination bit to generate a first binary bit;

a sixth XOR gate configured to perform the XOR operation on the second Gray bit and the first binary bit to generate a second binary bit; and a seventh XOR gate configured to perform the XOR operation on the third Gray bit and the second binary bit to generate a third binary bit.

19. The digital CDS circuit of claim 18, wherein the first signal line is configured to output a first reset Gray bit corresponding to the MSB of the first Gray code during a first duration for detecting the reset component, wherein the first XOR gate is configured to generate a second reset Gray bit of the first Gray code during the first duration, wherein the fourth XOR gate is configured to generate a third reset Gray bit of the first Gray code during the first duration, wherein the fifth XOR gate is configured to generate a first reset binary bit of the first binary code during the first duration, wherein the sixth XOR gate is configured to generate a second reset binary bit of the first binary code during the first duration, wherein the seventh XOR gate is configured to generate a third reset binary bit of the first binary code during the first duration.

20. The digital CDS circuit of claim 18, wherein the second latch circuit comprises:
- a first reset latch configured to latch an output of the fifth XOR gate in response to the second control signal;
- a second reset latch configured to latch an output of the sixth XOR gate in response to the second control signal; and
- a third reset latch configured to latch an output of the seventh XOR gate in response to the second control signal.

* * * * *